(12) United States Patent
Koyama

(10) Patent No.: US 9,378,776 B2
(45) Date of Patent: Jun. 28, 2016

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventor: Jun Koyama, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/625,786

(22) Filed: Feb. 19, 2015

(65) Prior Publication Data
US 2015/0243332 A1   Aug. 27, 2015

(30) Foreign Application Priority Data
Feb. 21, 2014   (JP) .................. 2014-031790

(51) Int. Cl.
| | | |
|---|---|---|
| *G11C 5/06* | (2006.01) | |
| *G11C 11/418* | (2006.01) | |
| *G11C 5/10* | (2006.01) | |
| *G11C 8/16* | (2006.01) | |
| *G11C 11/408* | (2006.01) | |

(Continued)

(52) U.S. Cl.
CPC *G11C 5/063* (2013.01); *G11C 5/10* (2013.01); *G11C 8/16* (2013.01); *G11C 11/40* (2013.01); *G11C 11/408* (2013.01); *G11C 11/4087* (2013.01); *G11C 11/4096* (2013.01); *G11C 11/418* (2013.01)

(58) Field of Classification Search
CPC ......... G11C 5/063; G11C 5/10; G11C 11/418
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Hoai V Ho
*Assistant Examiner* — Tri Hoang
(74) *Attorney, Agent, or Firm* — Fish & Richardson P.C.

(57) ABSTRACT

A semiconductor device with a small cell area and excellent data read/write capability is achieved. In the semiconductor device, a wiring for writing data is provided, and a first transistor with a low off-state current is turned on to supply data to a gate of a second transistor and is turned off so that electric charge corresponding to data is retained. Moreover, a wiring for reading data is provided, and a third transistor is turned on so that data is read out in accordance with the on/off state of the second transistor retaining the electric charge. With this configuration, data write and data read are achieved in the same cycle.

8 Claims, 24 Drawing Sheets

(51) Int. Cl.
  *G11C 11/4096*  (2006.01)
  *G11C 11/40*  (2006.01)

(56) References Cited

U.S. PATENT DOCUMENTS

| | | | |
|---|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,970,251 B2 | 3/2015 | Kurokawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0036018 A1 | 2/2007 | Iwata |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0255325 A1* | 10/2011 | Nagatsuka ........... G11C 11/405 365/72 |
| 2012/0037972 A1 | 2/2012 | Yoneda |
| 2013/0272055 A1 | 10/2013 | Yamamoto |
| 2014/0269063 A1 | 9/2014 | Nagatsuka et al. |
| 2014/0367673 A1 | 12/2014 | Takahashi |
| 2014/0374747 A1 | 12/2014 | Kurokawa |
| 2015/0001529 A1 | 1/2015 | Kurokawa |
| 2015/0023114 A1 | 1/2015 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-059043 | 3/2007 |
| JP | 2013-251894 A | 12/2013 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultaviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

\* cited by examiner

FIG. 11A
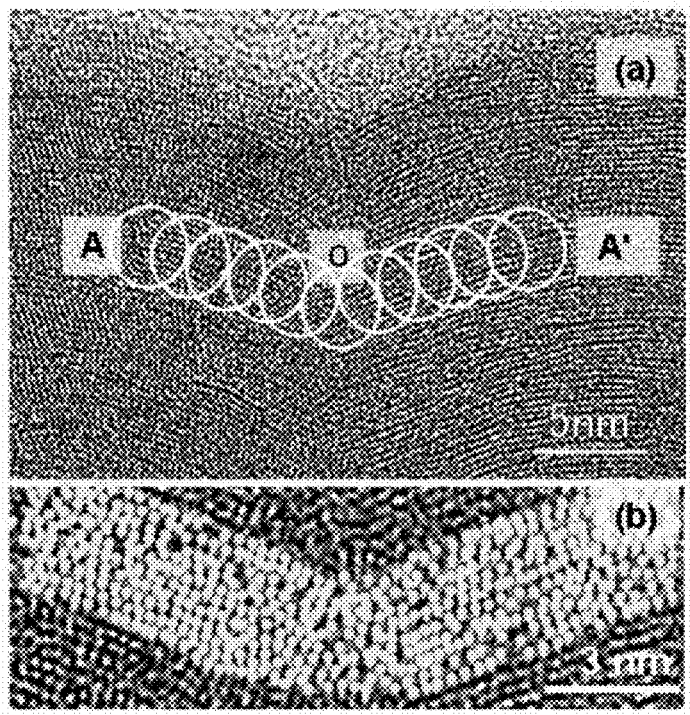
FIG. 11B
FIG. 11C
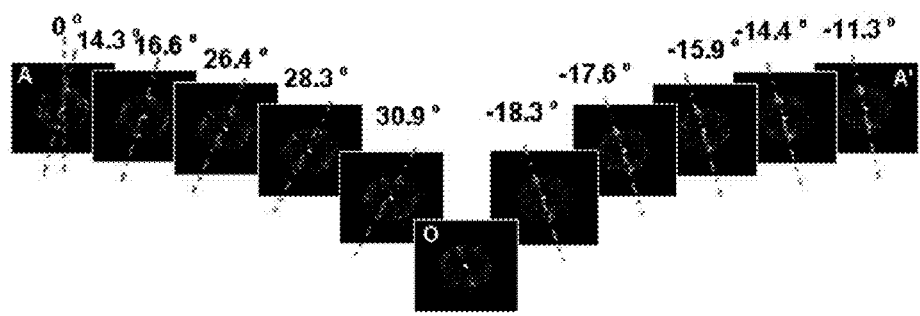

CAAC-OS nc-OS

As Sputtered    After Heating at 450 °C

□ Proportion of Non-CAAC    ☰ Proportion of CAAC

As Sputtered

After Heating at 450 °C

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device, an electronic component, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

Static random access memory (SRAM) is used as the cache memory of a processor or the like because data write and read can be performed at high speed.

The demand for fast access of SRAM used for image processing or the like is growing. In view of this, dual-port SRAM where data write and read can be controlled independently is suggested (e.g., see Patent Document 1).

REFERENCE

Patent Document 1: Japanese Published Patent Application No. 2007-059043

SUMMARY OF THE INVENTION

In a configuration based on SRAM, such as that of dual-port SRAM, the number of transistors is six or more. Given that the minimum feature size is F, the cell area of SRAM is 100 $F^2$ to 150 $F^2$ or even larger. Thus, SRAM has a larger cell area than flash memory and DRAM.

In view of the above, an object of one embodiment of the present invention is provide a semiconductor device or the like with a novel structure and a small cell area. Another object of one embodiment of the present invention is to provide a semiconductor device or the like that has a novel structure and is capable of controlling data write and read independently. Another object of one embodiment of the present invention is to provide a novel semiconductor device or the like.

Note that the objects of one embodiment of the present invention are not limited to the above. The objects described above do not disturb the existence of other objects. The other objects are objects that are not described above and will be described below. The other objects will be apparent from and can be derived from the description of the specification, the drawings, and the like by those skilled in the art. One embodiment of the present invention is to achieve at least one of the above objects and the other objects.

One embodiment of the present invention is a semiconductor device including first to third transistors and a capacitor. A gate of the first transistor is electrically connected to a first wiring. One of a source and a drain of the first transistor is electrically connected to a second wiring. A gate of the second transistor is electrically connected to the other of the source and the drain of the first transistor and one electrode of the capacitor. One of a source and a drain of the second transistor is electrically connected to a third wiring. A gate of the third transistor is electrically connected to a fourth wiring. One of a source and a drain of the third transistor is electrically connected to the other of the source and the drain of the second transistor. The other of the source and the drain of the third transistor is electrically connected to a fifth wiring. The other electrode of the capacitor is electrically connected to a sixth wiring. The first wiring is capable of transmitting a first signal. The second wiring is capable of transmitting a second signal. The third wiring is capable of transmitting a first potential. The fourth wiring is capable of transmitting a third signal. The fifth wiring is capable of transmitting a second potential. The sixth wiring is capable of transmitting a fourth signal. The first signal is capable of turning on the first transistor so that a potential of the second signal is supplied to the gate of the second transistor. The third signal is capable of turning on the third transistor so that the second potential is supplied to the one of the source and the drain of the third transistor. The fourth signal is capable of controlling an on/off state of the second transistor in accordance with the potential of the second signal supplied to the gate of the second transistor so that the first potential is supplied to the other of the source and the drain of the second transistor.

Note that other embodiments of the present invention will be shown in Embodiments 1 to 6 and the drawings.

One embodiment of the present invention can provide a semiconductor device or the like with a novel structure and a small cell area, resulting in a small semiconductor device. Another embodiment of the present invention can provide a semiconductor device or the like that has a novel structure and can independently control data write and read, and thus can operate at high speed. Another embodiment of the present invention can provide a novel semiconductor device or the like.

Note that the effects of one embodiment of the present invention are not limited to the above. The effects described above do not disturb the existence of other effects. The other effects are effects that are not described above and will be described below. The other effects will be apparent from and can be derived from the description of the specification, the drawings, and the like by those skilled in the art. One embodiment of the present invention is to have at least one of the above effects and the other effects. Accordingly, one embodiment of the present invention does not have the above effects in some cases.

BRIEF DESCRIPTION OF THE DRAWINGS

In the accompanying drawings:

FIGS. 11A and 11B are cross-sectional TEM images of an oxide semiconductor, and FIG. 11C shows local Fourier transform images of the oxide semiconductor;

DETAILED DESCRIPTION OF THE INVENTION

Figure 1:
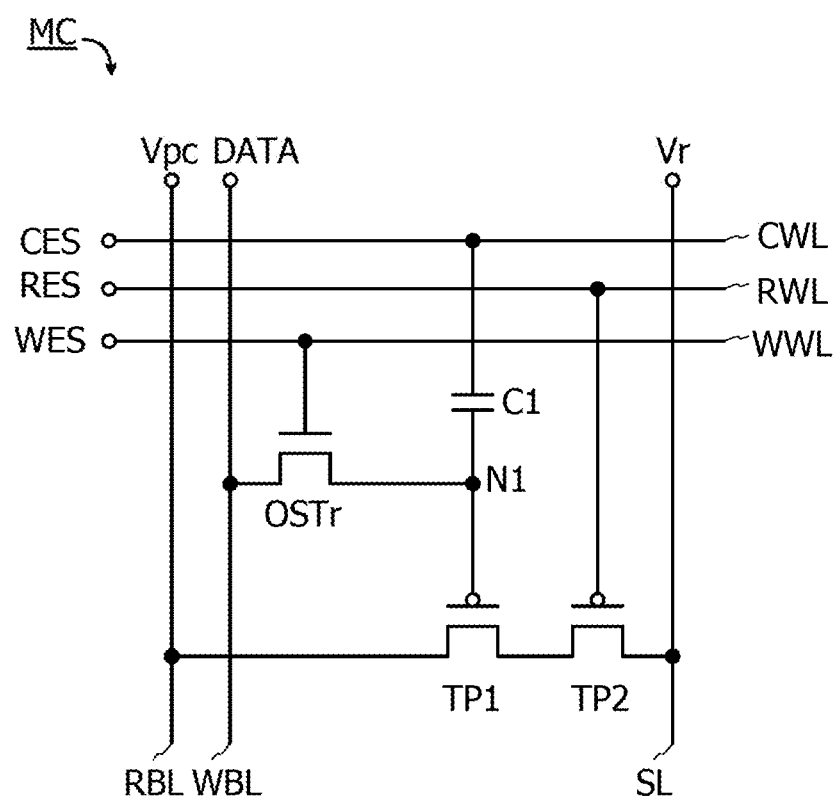
FIG. 1 is a circuit diagram illustrating one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variation in signal, voltage, or current due to noise or difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Since the source and the drain of the transistor may change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification, ordinal numbers such as first, second, and third are used to avoid confusion among components, and thus do not limit the number of the components.

In this specification, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through Z1 (or by bypassing Z1) and a drain (or a second terminal or the like) of the transistor is electrically connected to Y through Z2 (or by bypassing Z2), or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other such that X, the source (or the first terminal or the like) of the transistor, the drain (or the second terminal or the like) of the transistor, and Y are electrically connected to each other in this order"; "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are only examples, and there is no limitation on the expressions. Here, X, Y, Z1, and Z2 each denote an object (e.g., a device, an element, a circuit, a wiring, an electrode, a terminal, a conductive film, or a layer).

In this specification, terms for explaining arrangement, such as over and under, are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

The positional relation of circuit blocks in a block diagram is specified for description. Even when a block diagram shows that different functions are achieved by different circuit blocks, one circuit block may be actually configured to achieve different functions. Functions of circuit blocks in a diagram are specified for description, and even when a diagram shows one circuit block performing given processing, a plurality of circuit blocks may be actually provided to perform the processing.

Embodiment 1

In this embodiment, examples of a circuit diagram and a timing chart of a semiconductor device will be described.

In this specification and the like, a semiconductor device means any device that can function by utilizing semiconductor characteristics; thus, random access memory (RAM) composed of semiconductor elements such as transistors, a RAM cell, and a memory circuit are included in the category of the semiconductor device.

FIG. 1 illustrates a configuration of a memory cell that is a semiconductor device.

A memory cell MC illustrated in FIG. 1 includes a transistor OSTr, a transistor TP1, a transistor TP2, and a capacitor C1. A gate of the transistor TP1 is represented as a node N1.

FIG. 1 showing the memory cell MC illustrates a wiring WWL for supplying a write word signal WES, a wiring RWL for supplying a read word signal RES, a wiring CWL for supplying a capacitor word signal CES, a wiring WBL for supplying a data signal DATA, a wiring RBL for supplying a precharge voltage Vpc, and a wiring SL for supplying a read voltage Vr.

The memory cell MC is a RAM cell, for example. Data is written to the memory cell MC by supply of a potential of the data signal DATA under the control of the write word signal WES and the capacitor word signal CES. Data can be read from the memory cell MC in such a manner that the read word signal RES and the capacitor word signal CES are controlled and a change in the precharge voltage Vpc corresponding to the potential of the data signal DATA is detected by an external circuit.

In the configuration of the memory cell MC in FIG. 1, the wiring WBL for supplying the data signal DATA and the wiring RBL for supplying the precharge voltage Vpc are separately provided. Accordingly, by controlling the write word signal WES, the capacitor word signal CES, and the read word signal RES, data write and read can be performed in the same cycle. For example, data write to the memory cell MC in a first row and data read from the memory cell MC in a third row can be performed at the same time.

With the configuration of the memory cell MC in one mode of Embodiment 1, data write and read can be controlled independently as in dual-port SRAM, so that fast access is achieved as in dual-port SRAM. Furthermore, the configuration of the memory cell MC in one mode of Embodiment 1 achieves a function of dual-port SRAM with fewer transistors, leading to a smaller memory cell area than that of dual-port SRAM.

Next, components included in the memory cell MC will be described.

A gate of the transistor OSTr is connected to the wiring WWL. One of a source and a drain of the transistor OSTr is connected to the wiring WBL. The other of the source and the drain of the transistor OSTr is connected to the gate of the transistor TP1.

The transistor OSTr is preferably a transistor using an oxide semiconductor for a semiconductor layer where a channel is formed (such a transistor is also referred to as an OS transistor).

An OS transistor is an accumulation-type transistor in which electrons are majority carriers. An electric field extended from a region where semiconductor layer is in contact with a source electrode and a drain electrode to a channel formation region is blocked within a short distance. Thus, short-channel effects are unlikely to occur in the OS transistor, so that an LDD region is not required. In other words, a shorter channel length does not lead to lower mobility in the OS transistor.

In contrast, in a Si transistor with a short channel, short-channel effects arise. To prevent short-channel effects, the Si transistor needs to be provided with an LDD region. The mobility of the Si transistor is lowered by the influence of the LDD region. The configuration of the memory cell MC including the OS transistor can solve the issue of mobility reduction of a fine Si transistor due to mobility dependence on gate length.

When there is a large difference in mobility between a Si transistor and an OS transistor that have a gate length with which short-channel effects do not occur, the gate width of the OS transistor needs to be set larger than that of the Si transistor. In contrast, with a smaller gate length due to miniaturization with which short-channel effects occur, the difference in mobility between a Si transistor and an OS transistor is reduced. Accordingly, the memory cell MC including the OS transistor enables a reduction in difference in gate width between the OS transistor and the Si transistor.

An OS transistor can exhibit ultra-low off-state current.

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $1 \times 10^{17}/cm^3$, preferably lower than $1 \times 10^{15}/cm^3$, further preferably lower than $1 \times 10^{13}/cm^3$, particularly preferably lower than $8 \times 10^{11}/cm^3$, still further preferably lower than $1 \times 10^{11}/cm^3$, yet further preferably lower than $1 \times 10^{10}/cm^3$ and of $1 \times 10^{-9}/cm^3$ or higher. In the oxide semiconductor, hydrogen, nitrogen, carbon, silicon, and metal elements other than main components are impurities. For example, hydrogen and nitrogen form donor levels to increase the carrier density.

A transistor using an intrinsic or substantially intrinsic oxide semiconductor has a low carrier density and thus is less likely to have negative threshold voltage. Moreover, because of few carrier traps in the oxide semiconductor, the transistor using the oxide semiconductor has small variation in electrical characteristics and high reliability. Furthermore, the transistor using the oxide semiconductor achieves ultra-low off-state current.

For example, the OS transistor with reduced off-state current can exhibit a normalized off-state current per micrometer in channel width of $1 \times 10^{-18}$ A or less, preferably $1 \times 10^{-21}$ A or less, more preferably $1 \times 10^{-24}$ A or less at room temperature (approximately 25° C.), or $1 \times 10^{-15}$ A or less, preferably $1 \times 10^{-18}$ A or less, more preferably $1 \times 10^{-21}$ A or less at 85° C.

Note that the off-state current of an n-channel transistor is a current that flows between a source and a drain when the transistor is off. For example, the off-state current of an n-channel transistor with a threshold voltage of about 0 V to 2 V refers to a current that flows between a source and a drain when a negative voltage is applied between a gate and the source.

An OS transistor can have favorable switching characteristics.

An OS transistor is formed over an insulating surface; thus, unlike in a Si transistor using a semiconductor substrate as a channel formation region, parasitic capacitance is not generated between a gate electrode and a semiconductor substrate. Consequently, with the use of the OS transistor, carriers can be controlled easily with a gate electric field, and favorable switching characteristics are obtained.

Although a Si transistor requires a thin gate insulating film to prevent short-channel effects, a gate insulating film of an OS transistor does not need to be made thin because the short-channel effects can be prevented in the OS transistor. Thus, in the OS transistor, a gate insulating film can be thick, which will lead to a reduction in parasitic capacitance. Moreover, unnecessity of the LDD region will result in a further reduction in parasitic capacitance of the OS transistor.

Since parasitic capacitance can be prevented from being generated in the transistor OSTr as described above, the gate capacitance of the transistor OSTr can be low, thereby preventing a feedthrough effect occurring when the transistor OSTr is turned off.

The write word signal WES supplied to the wiring WWL is a signal for controlling the on/off state of the transistor OSTr. In this specification, the transistor OSTr is an n-channel transistor; consequently, the transistor OSTr is turned on when the write word signal WES has an H-level potential and is turned off when the write word signal WES has an L-level potential.

The data signal DATA supplied to the wiring WBL is a signal based on data to be written to the memory cell MC. Examples of the data signal DATA written to the memory cell MC through the wiring WBL are an H-level potential as data '1' and an L-level potential as data '0'. The data signal DATA is supplied to the node N1, and the on/off state of the transistor TP1 is controlled depending on the potential held at the node N1. In the description of FIG. 1, the transistor TP1 is a p-channel transistor; thus, the transistor TP1 is turned on when the data signal DATA has an L-level potential and is turned off when the data signal DATA has an H-level potential.

One electrode of the capacitor C1 is connected to the gate of the transistor TP1. The other electrode of the capacitor C1 is connected to the wiring CWL.

The capacitor word signal CES supplied to the wiring CWL is a signal for varying the potential of the node N1 by capacitive coupling when the node N1 is electrically floating.

For example, when the node N1 is made electrically floating at an H-level potential VH (>VL) and then the potential of the capacitor word signal CES is changed from L level to H level, the potential of the node N1 can increase from the H-level potential to a potential VH+ (>VH). When the potential of the capacitor word signal CES is changed from H level to L level, the increased potential VH+ can decrease to the potential VH.

For another example, when the node N1 is made electrically floating at the L-level potential VL and then the potential of the capacitor word signal CES is changed from L level to H level, the potential of the node N1 can increase from the L-level potential to the potential VH. When the potential of the capacitor word signal CES is changed from H level to L level, the increased potential VH can decrease to the potential VL.

In data writing, by setting the capacitor word signal CES at L level in advance, the potential VL written to the node N1 can be subsequently retained as the potential VH. Therefore, the transistor TP1 is not turned on unless the capacitor word signal CES is set at L level again. In other words, when the potential VL is written to the node N1, the transistor TP1 can be prevented from being turned on in periods other than a data reading period.

In data writing, by setting the capacitor word signal CES at L level in advance, the H-level potential VH written to the node N1 can be retained as the potential VH+. Thus, the potential of the node N1 can be the potential VH even when the potential of the capacitor word signal CES is changed from L level to H level to read data. Consequently, when the potential VH is written to the node N1, the transistor TP1 can be prevented from being turned on even if the potential of the capacitor word signal CES is changed from L level to H level.

The gate of the transistor TP1 is connected to the other of the source and the drain of the transistor OSTr. One of a source and a drain of the transistor TP1 is connected to the wiring RBL. The other of the source and the drain of the transistor TP1 is connected to one of a source and a drain of the transistor TP2.

A gate of the transistor TP2 is connected to the wiring RWL. The one of the source and the drain of the transistor TP2 is connected to the other of the source and the drain of the transistor TP1. The other of the source and the drain of the transistor TP2 is connected to the wiring SL.

The read word signal RES supplied to the wiring RWL is a signal for controlling the on/off state of the transistor TP2. In FIG. 1, the transistor TP2 is a p-channel transistor; thus, the transistor TP2 is turned on when the read word signal RES has an L-level potential and is turned off when the read word signal RES has an H-level potential.

Note that the transistors TP1 and TP2 are preferably transistors using silicon for a semiconductor layer where a channel is formed. Such a transistor is preferable because it can be overlapped by a transistor using an oxide semiconductor for a semiconductor layer where a channel is formed, resulting in a reduction in size of a semiconductor device.

The potential Vpc supplied to the wiring RBL is higher than a potential VDD or the potential Vr, for example. After being supplied with the potential Vpc, the wiring RBL is made electrically floating and its potential varies depending on the on/off state of the transistors TP1 and TP2. The potential Vr supplied to the wiring SL is lower than a potential VSS, a potential GND, or the potential Vpc, for example. Note that the potential VDD is a high power supply potential, the potential VSS is a low power supply potential, and the potential GND is a ground potential.

To read data, the potential of the capacitor word signal CES is changed from H level to L level so that the potential of the node N1 is set at a potential written as the data signal DATA, and the read word signal RES is set at L level to turn on the transistor TP2. Accordingly, the on/off state of the transistor TP1 is determined depending on the potential written as the data signal DATA.

For example, when the node N1 has the potential VL and the transistor TP1 is on, the potential difference between the wiring RBL and the wiring SL occurs and a current flows. When a current starts to flow, the potential Vpc supplied to the wiring RBL in an electrically floating state changes.

When the node N1 has the potential VH and the transistor TP1 is off, a potential difference does not occur between the wiring RBL and the wiring SL and a current does not flow. With no current flowing, the potential Vpc supplied to the wiring RBL in an electrically floating state does not change.

By detecting this change in the potential Vpc of the wiring RBL by an external read circuit, data can be read out.

The data write and data read can be performed independently by controlling the write word signal WES and the read word signal RES when the capacitor word signal CES is set at L level. Thus, fast access is achieved as in dual-port SRAM. Furthermore, the configuration of the memory cell MC in one mode of Embodiment 1 achieves a function of dual-port SRAM with fewer transistors, whereby the memory cell MC enables fast access and can have a smaller area than dual-port SRAM.

Figure 2:
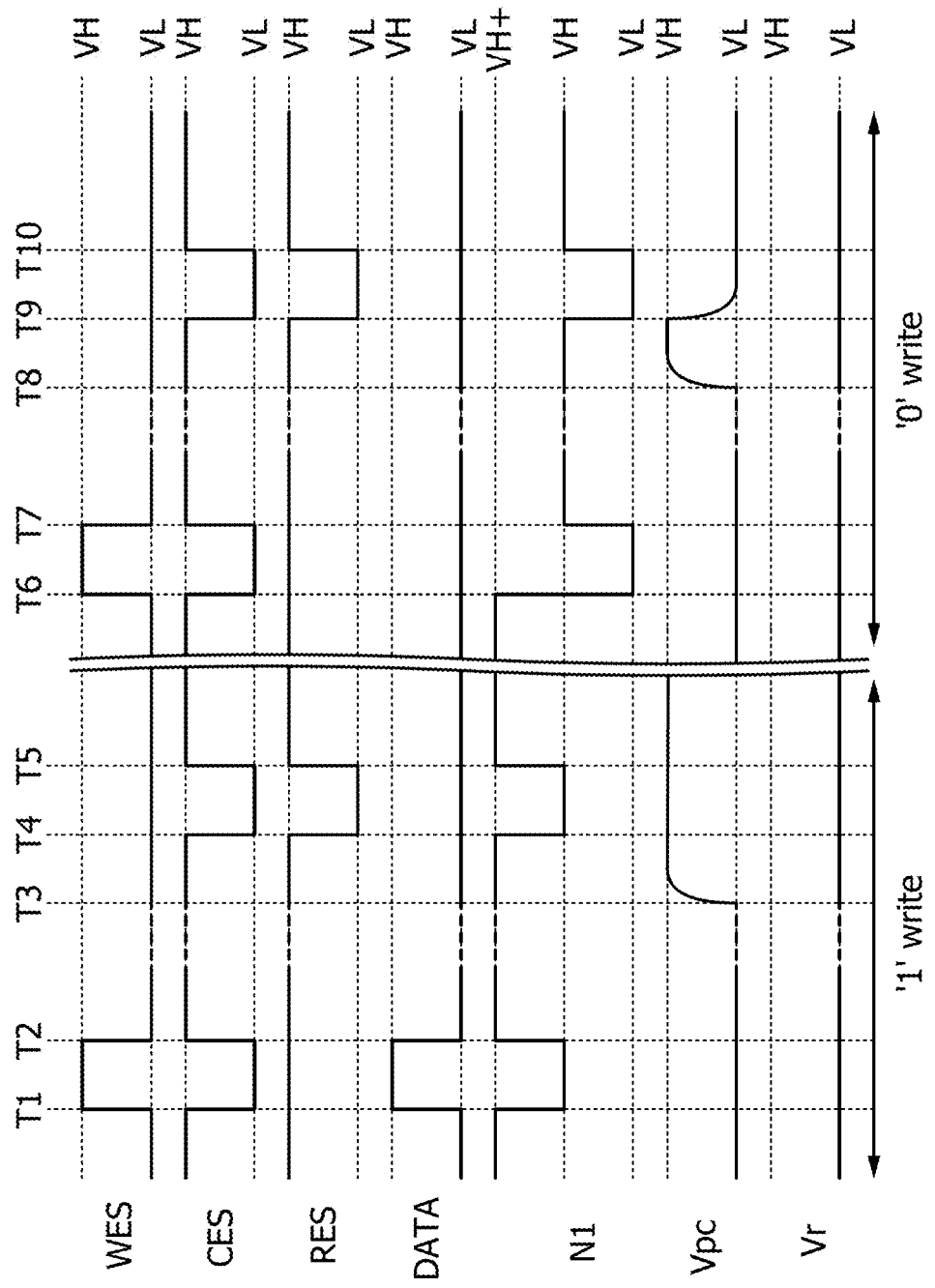
FIG. 2 is a timing chart for explaining one embodiment of the present invention.

Next, the operation of the memory cell MC illustrated in FIG. 1 will be described. FIG. 2 is a timing chart of the potential of the node and signals input to and output from the circuit illustrated in FIG. 1.

FIG. 2 shows changes in the write word signal WES, the read word signal RES, the capacitor word signal CES, the data signal DATA, the potential of the node N1, the potential Vpc, and the potential Vr in FIG. 1. In FIG. 2, time T1 to time T10 are given for explanation; data '1' is written as the data signal DATA and read out from the time T1 to the time T5, and data '0' is written as the data signal DATA and read out from the time T6 to the time T10.

For clarification, the potential of each of the wirings in FIG. 2 switches between the H-level potential VH and the L-level potential VL. The node N1 can have at least three levels of potential under control of the capacitor word signal CES as described above; therefore, the description is made using the potential VH+ in addition to the potential VH and the potential VL.

First, at the time T1, the operation of writing data '1' starts.

At the time T1, the write word signal WES and the read word signal RES are set at H level, the capacitor word signal CES is set at L level, and the data signal DATA is set at H level. Thus, the transistor OSTr is turned on, and the potential of the node N1 becomes the potential VH. Since the transistor TP2 is off, no current flows through the transistor TP2 regardless of whether the wiring RBL is precharged with the potential Vpc.

At the time T2, the operation of writing data '1' is completed.

At the time T2, the capacitor word signal CES is set at H level, the read word signal RES is kept at H level, the write word signal WES is set at L level, and the data signal DATA is set at L level. The node N1 is made electrically floating because the transistor OSTr is turned off, and the potential VH of the node N1 increases to the potential VH+ to accompany the change of the capacitor word signal CES from the L-level potential to the H-level potential.

By keeping the transistor OSTr off, the memory cell MC can retain the potential VH+, which is obtained by increasing the potential VH. Note that in a period for retaining a potential corresponding to data, a predetermined potential is continuously supplied to the transistor OSTr in some cases. For example, the gate of the transistor OSTr may be continuously supplied with a voltage that turns off the transistor completely. Moreover, a back gate of the transistor OSTr may be continuously supplied with a voltage that shifts the threshold voltage of the transistor to make the transistor in a normally-off state. In these cases, a voltage is supplied to the memory cell MC in the period for retaining data; however, little power is consumed because almost no current flows. Because of little power consumption, the memory cell MC can be regarded as being substantially nonvolatile even if a predetermined voltage is supplied to the memory cell MC.

At the time T3, the precharge operation for reading data '1' starts.

At the time T3, the capacitor word signal CES and the read word signal RES are kept at H level, the write word signal WES is kept at L level, and the data signal DATA is kept at L level. Then, the potential Vpc is set at H level and the wiring RBL is made electrically floating. Since the transistor TP2 is off, no current flows through the transistor TP2 even if the wiring RBL is precharged with the potential Vpc.

At the time T4, the operation of reading data '1' starts.

At the time T4, the write word signal WES is kept at L level, the capacitor word signal CES and the read word signal RES are set at L level, and the data signal DATA is kept at L level. The node N1 is electrically floating because the transistor OSTr is off, and the potential of the node N1 decreases to the potential VH to accompany the change of the capacitor word signal CES from the H-level potential to the L-level potential. Thus, the transistor TP1 is turned off and the transistor TP2 is turned on. Since current does not flow through the transistors TP1 and TP2, the potential Vpc that becomes H level by precharging is unchanged.

At the time T5, the operation of reading data '1' is completed.

At the time T5, the capacitor word signal CES and the read word signal RES are set at H level, the write word signal WES is kept at L level, and the data signal DATA is kept at L level. The node N1 is electrically floating because the transistor OSTr is off, and the potential of the node N1 increases to the potential VH+ to accompany the change of the capacitor word signal CES from the L-level potential to the H-level potential.

Then, at the time T6, the operation of writing data '0' starts.

At the time T6, the write word signal WES is set at H level, the read word signal RES is kept at H level, the capacitor word signal CES is set at L level, and the data signal DATA is kept at L level. The transistor OSTr is turned on, and the potential of the node N1 becomes the potential VL. Since the transistor TP2 is off, no current flows through the transistor TP2 regardless of whether the wiring RBL is precharged with the potential Vpc.

At the time T7, the operation of writing data '0' is completed.

At the time T7, the capacitor word signal CES is set at H level, the read word signal RES is kept at H level, the write word signal WES is set at L level, and the data signal DATA is kept at L level. The node N1 is electrically floating because the transistor OSTr is off, and the potential VL of the node N1 increases to the potential VH to accompany the change of the capacitor word signal CES from the L-level potential to the H-level potential.

By keeping the transistor OSTr off, the memory cell MC can retain the potential VH, which is obtained by increasing the potential VL.

At the time T8, the precharge operation for reading data '0' starts.

At the time T8, the capacitor word signal CES and the read word signal RES are kept at H level, the write word signal WES is kept at L level, and the data signal DATA is kept at L level. Then, the potential Vpc is set at H level and the wiring RBL is made electrically floating. Since the transistor TP2 is off, no current flows through the transistor TP2 even if the wiring RBL is precharged with the potential Vpc.

At the time T9, the operation of reading data '0' starts.

At the time T9, the write word signal WES is kept at L level, the capacitor word signal CES and the read word signal RES are set at L level, and the data signal DATA is kept at L level. The node N1 is electrically floating because the transistor OSTr is off, and the potential of the node N1 decreases to the potential VL to accompany the change of the capacitor word signal CES from the H-level potential to the L-level potential. The transistors TP1 and TP2 are turned on. Current flows through the transistors TP1 and TP2, and the potential Vpc that becomes H level by precharging changes to L level.

At the time T10, the operation of reading data '0' is completed.

At the time T10, the capacitor word signal CES and the read word signal RES are set at H level, the write word signal WES is kept at L level, and the data signal DATA is kept at L level. The node N1 is electrically floating because the transistor OSTr is off, and the potential of the node N1 increases to the potential VH to accompany the change of the capacitor word signal CES from the L-level potential to the H-level potential.

In the operation of the memory cell MC in FIG. 1 described using FIG. 2, by setting the capacitor word signal CES at L level in advance in data writing, the potential VL written to the node N1 can be subsequently retained as the potential VH or the potential VH+.

Consequently, the transistor TP1 is not turned on unless the capacitor word signal CES is set at L level again. Furthermore, current for reading data does not flow between the wiring RBL and the wiring SL unless the transistor TP2 is turned on. Thus, the data write operation does not influence the data read operation.

When the data read operation is performed by changing the capacitor word signal CES from H level to L level, the transistor OSTr is not turned on unless the write word signal WES is set at H level. Thus, the data read operation does not influence the data write operation.

The data read operation and the data write operation do not influence each other and thus can be performed independently of each other. As a result, fast access is achieved as in dual-port SRAM. The configuration of the memory cell MC in one mode of Embodiment 1 achieves a function of dual-port SRAM with fewer transistors, whereby the memory cell MC enables fast access and can have a smaller area than dual-port SRAM.

Although FIG. 1 illustrates the example where the transistors TP1 and TP2 are p-channel transistors, n-channel transistors may be used.

Figure 3:
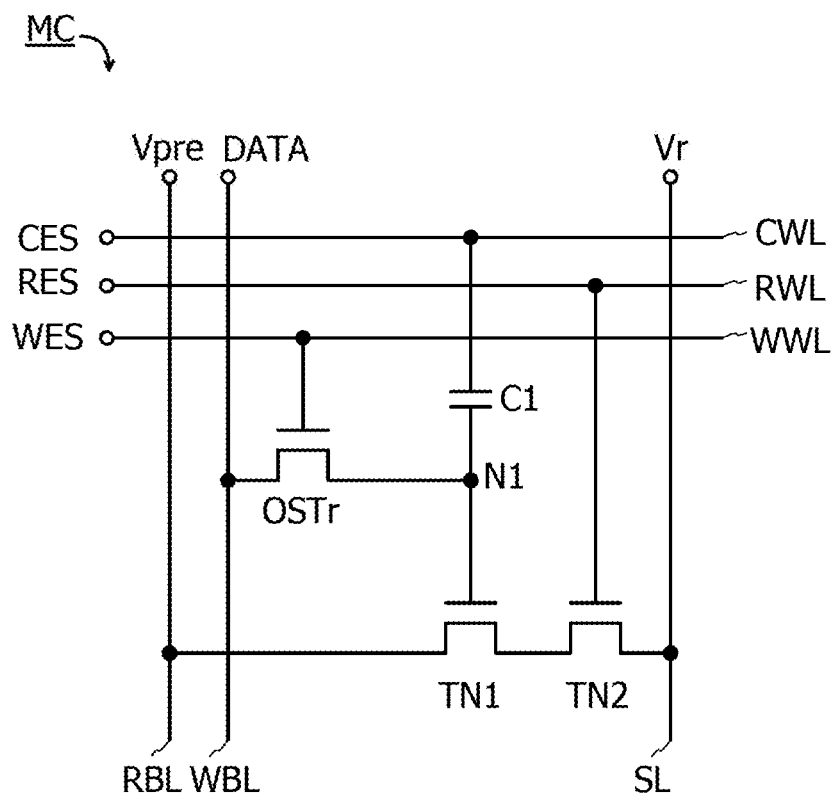
FIG. 3 is a circuit diagram illustrating one embodiment of the present invention.

For example, as in a configuration illustrated in FIG. 3, the transistors TP1 and TP2 in FIG. 1 may be replaced with n-channel transistors TN1 and TN2.

Figure 4:
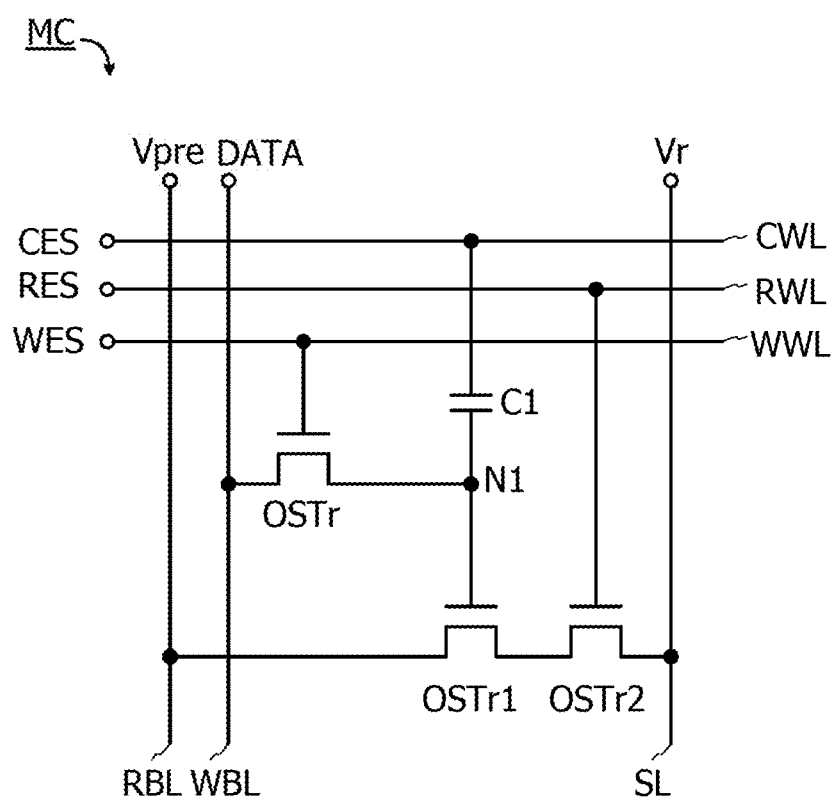
FIG. 4 is a circuit diagram illustrating one embodiment of the present invention.

As another example, the transistors TN1 and TN2 in FIG. 3 may be replaced with transistors using the same semiconductor layer as the transistor OSTr with low off-state current. For example, as in a configuration illustrated in FIG. 4, the transistors TN1 and TN2 in FIG. 3 may be replaced with transistors OSTr1 and OSTr2 using the same semiconductor layer as the transistor OSTr.

Figure 5:
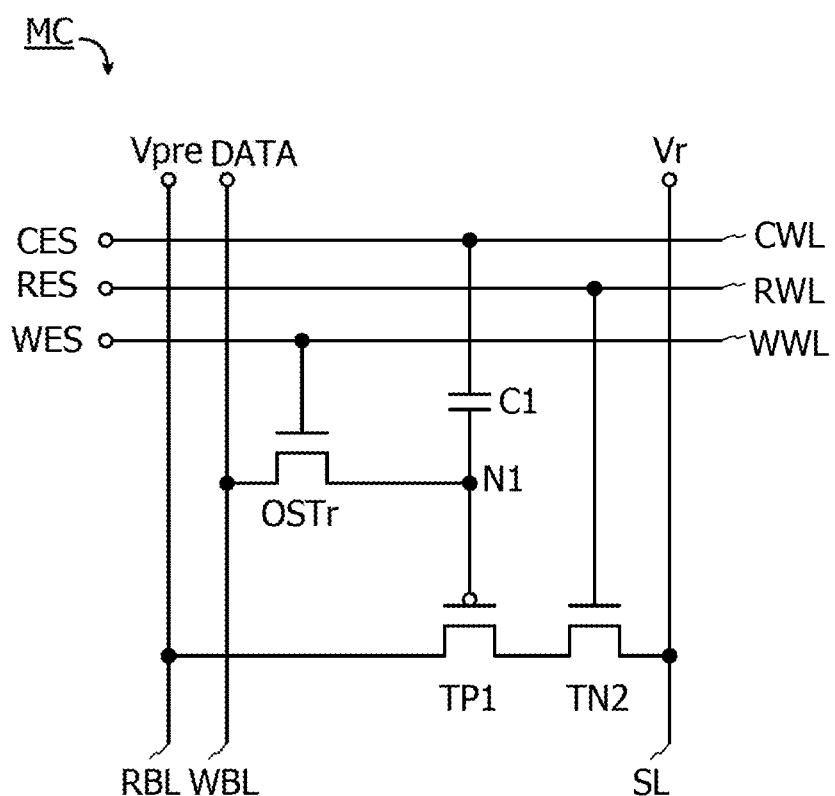
FIG. 5 is a circuit diagram illustrating one embodiment of the present invention.
Figure 6:
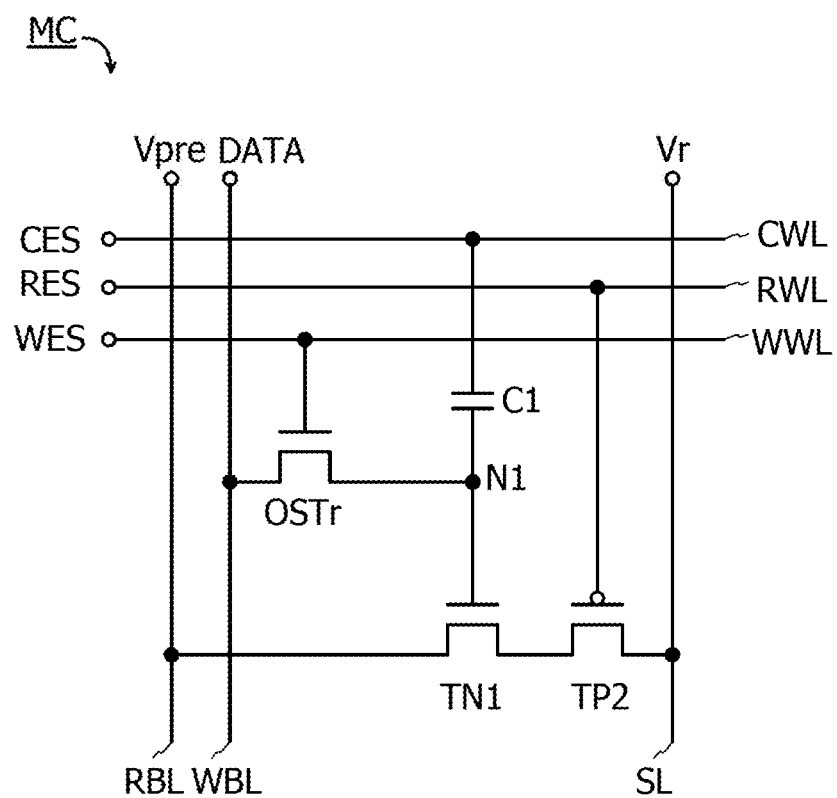
FIG. 6 is a circuit diagram illustrating one embodiment of the present invention.

As another example, an n-channel transistor may be substituted for one of the transistors TP1 and TP2 in FIG. 1. For example, the transistor TP2 in FIG. 1 may be replaced with the n-channel transistor TN2 as illustrated in FIG. 5. Alternatively, the transistor TP1 in FIG. 1 may be replaced with the n-channel transistor TN1 as illustrated in FIG. 6.

Figure 7:
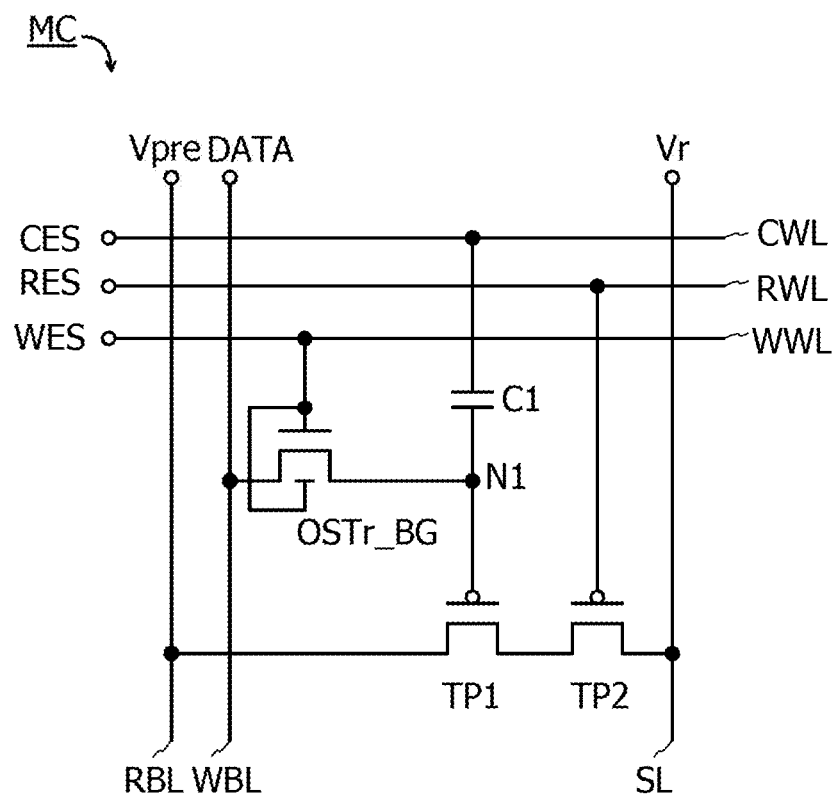
FIG. 7 is a circuit diagram illustrating one embodiment of the present invention.

As another example, the transistor OSTr in FIG. 1 may be a transistor with a back gate (also referred to as a second gate). For example, the transistor OSTr in FIG. 1 may be a transistor OSTr_BG with a back gate as illustrated in FIG. 7.

The placement of the transistors connected between the wiring SL and the wiring RBL can be changed as long as the transistors are connected in series. Some examples are illustrated in FIGS. 19 to 24. In other diagrams, the placement of the transistors can be changed in a similar manner.

This embodiment can be implemented in combination with any of the other embodiments as appropriate.

Embodiment 2

In this embodiment, an example of a RAM including the memory cell in FIG. 1 will be described with reference to FIGS. 8 to 10. Note that the RAM may be referred to as a memory device; a memory device includes a plurality of semiconductor devices.

<Configuration Example of RAM>

Figure 8:
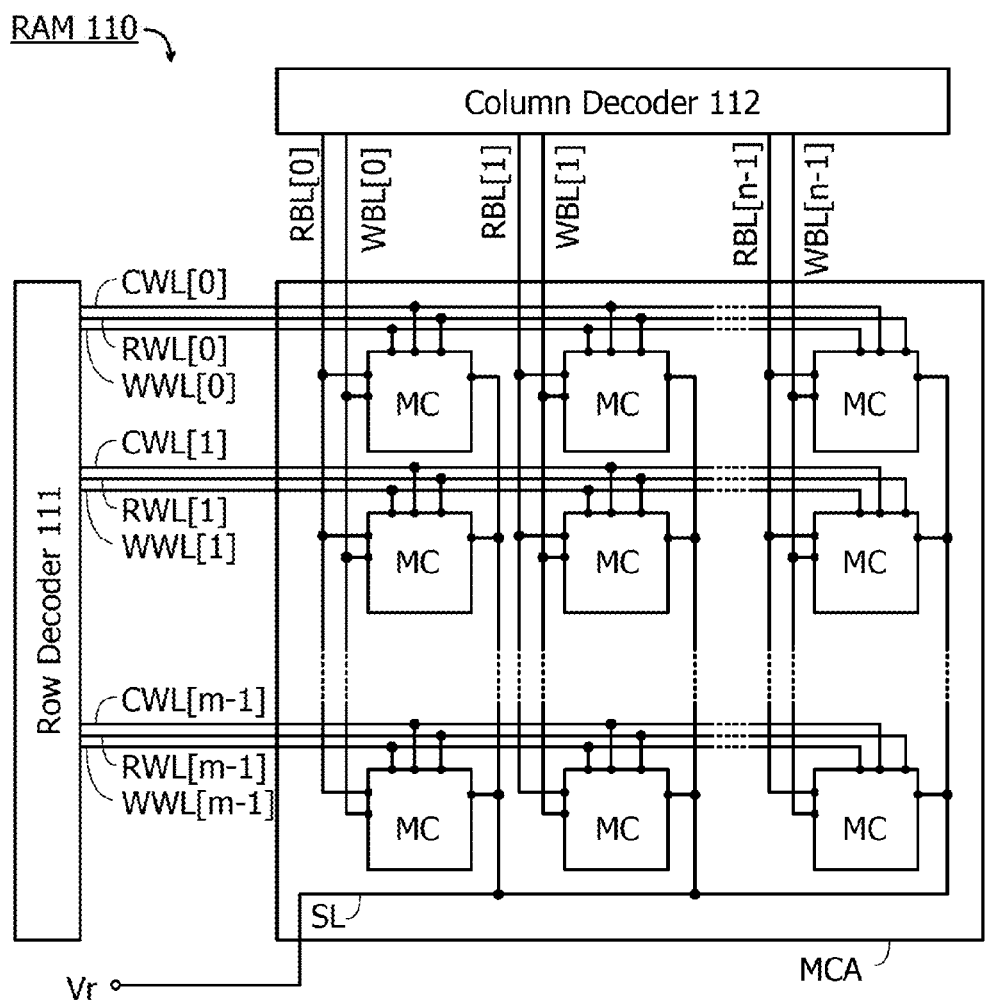
FIG. 8 is a circuit block diagram illustrating one embodiment of the present invention.

FIG. 8 is a block diagram illustrating a configuration example of a RAM including the memory cell MC in FIG. 1.

A RAM 110 illustrated in FIG. 8 includes a memory cell array MCA including a plurality of memory cells MC in FIG. 1, a row decoder 111, and a column decoder 112. In the RAM 110, the memory cells MC are arranged in a matrix of m rows and n columns.

FIG. 8 illustrates wirings WWL[0]-[m−1], wirings RWL[0]-[m−1], wirings CWL[0]-[m−1], wirings WBL[0]-[n−1], wirings RBL[0]-[n−1], and the wiring SL.

In the memory cell array MCA in FIG. 8, the memory cells MC illustrated in FIG. 1 are arranged in a matrix. In the memory cells MC in FIG. 1, data write and data read can be performed independently by controlling the write word signal WES and the read word signal RES when the capacitor word signal CES is set at L level. Thus, fast access is achieved as in dual-port SRAM. Furthermore, the memory cell MC realizes a function of dual-port SRAM with fewer transistors, whereby the memory cell MC enables fast access and can have a smaller area than dual-port SRAM.

The row decoder 111 is a circuit with a function of supplying a write word signal to the wirings WWL[0]-[m−1] connected to the memory cells MC, supplying a read word signal to the wirings RWL[0]-[m−1] connected to the memory cells MC, and supplying a capacitor word signal to the wirings CWL[0]-[m−1] connected to the memory cells MC. The row decoder 111 is a circuit for supplying a signal to these wirings and can be simply referred to as a circuit.

The column decoder 112 is a circuit with a function of supplying a data signal to the wirings WBL[0]-[n−1] connected to the memory cells MC and supplying a precharge potential to the wirings RBL[0]-[n−1] connected to the memory cells MC to make the wirings RBL[0]-[n−1] electrically floating. The column decoder 112 is a circuit for supplying a signal or a potential to these wirings and can be simply referred to as a circuit.

The memory cells MC are connected to the wiring SL and supplied with the potential Vr generated in a power supply circuit.

In the RAM 110 having the row decoder 111 and the column decoder 112, whether the memory cells MC are subjected to data write or data read can be selected row by row independently.

Figure 18:
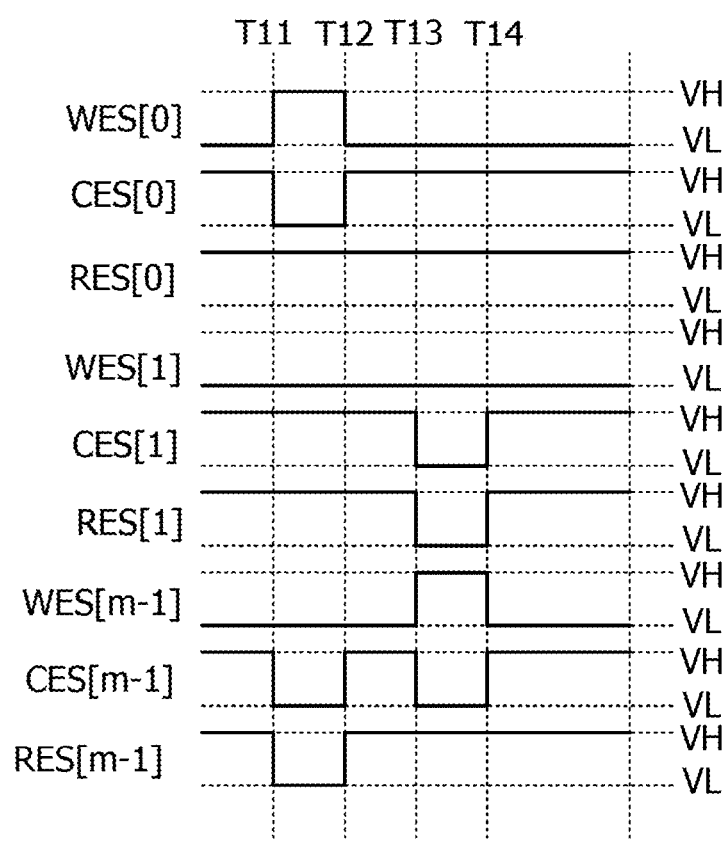
FIG. 18 is a timing chart for explaining one embodiment of the present invention.
Figure 19:
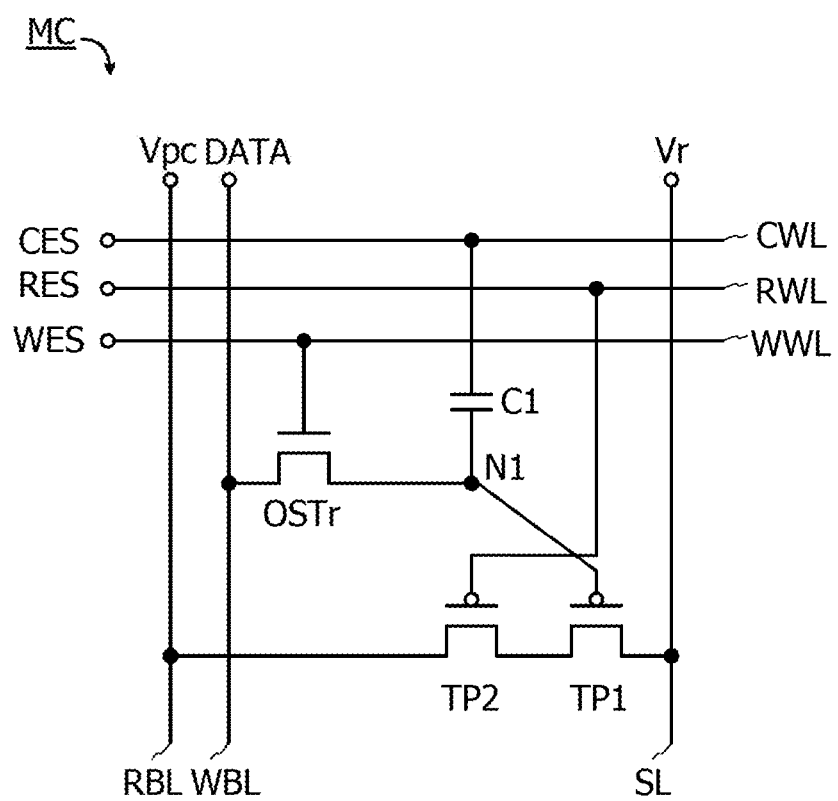
FIG. 19 is a circuit diagram illustrating one embodiment of the present invention.
Figure 20:
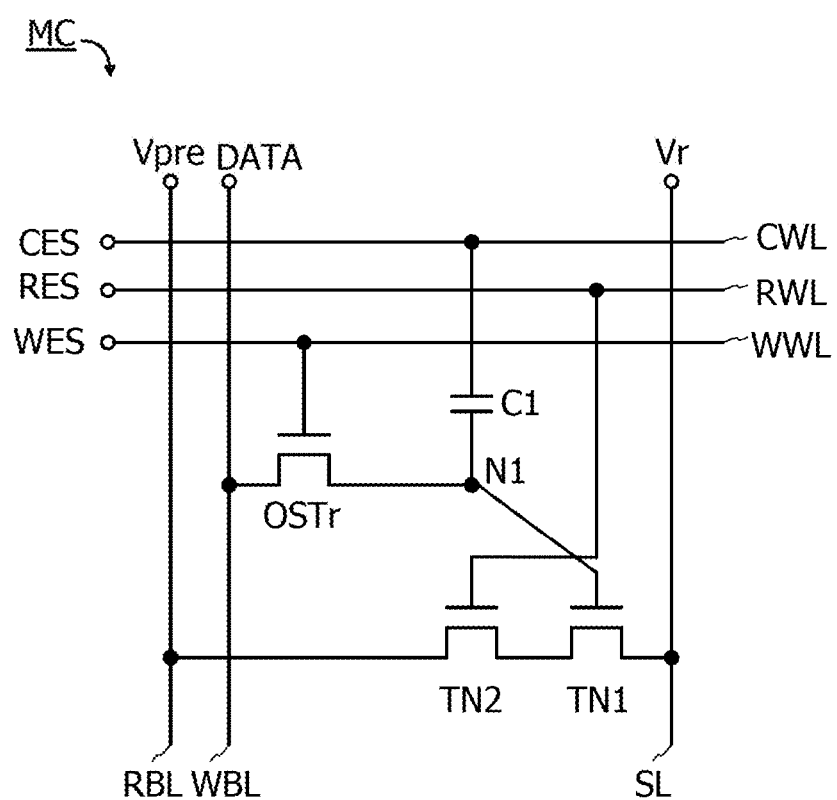
FIG. 20 is a circuit diagram illustrating one embodiment of the present invention.
Figure 21:
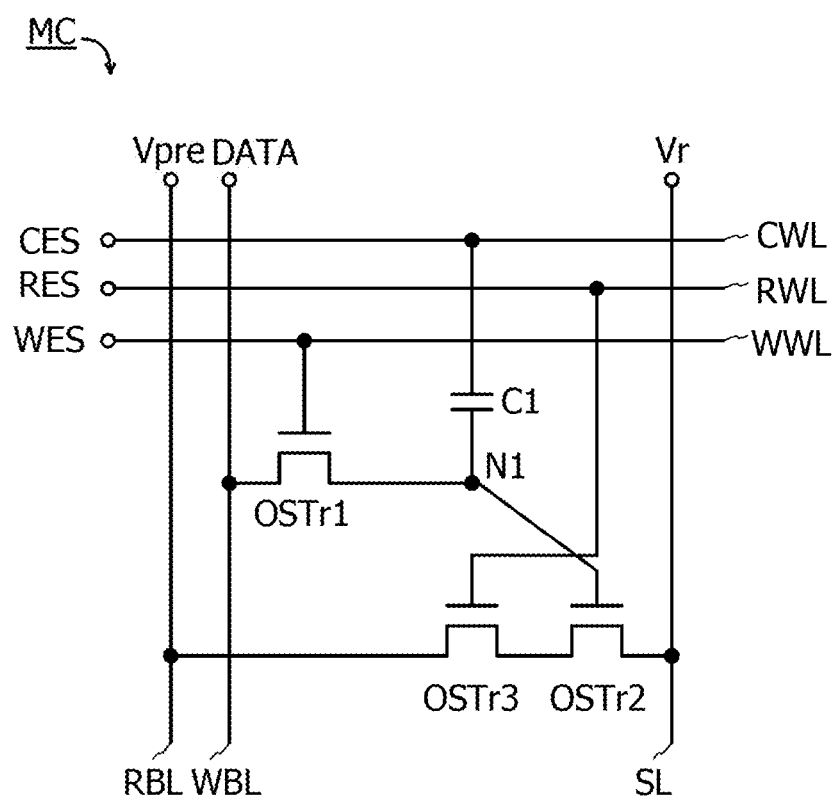
FIG. 21 is a circuit diagram illustrating one embodiment of the present invention.
Figure 22:
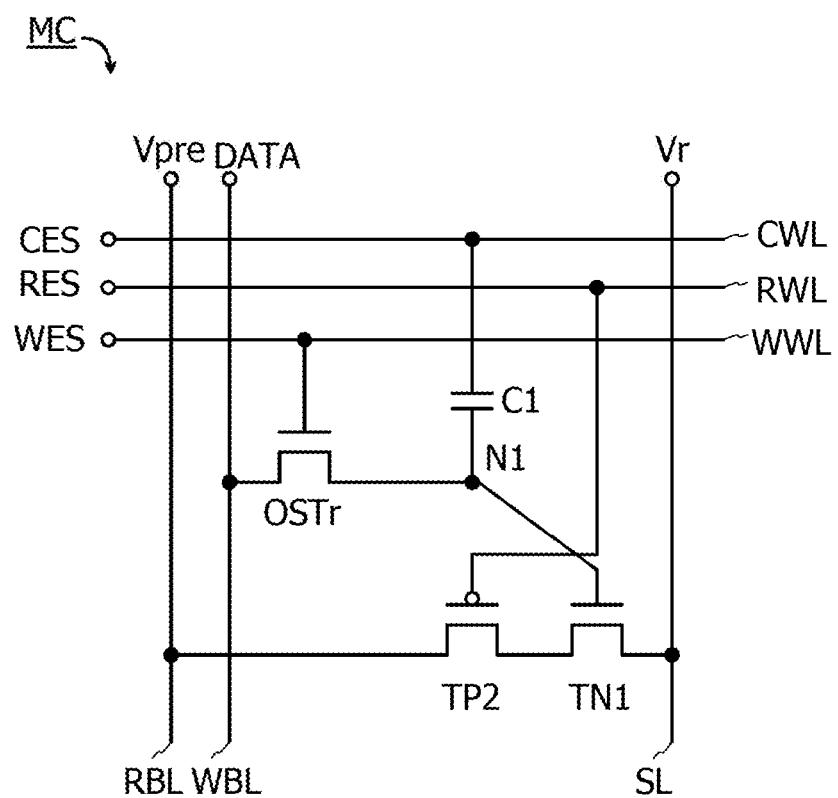
FIG. 22 is a circuit diagram illustrating one embodiment of the present invention.
Figure 23:
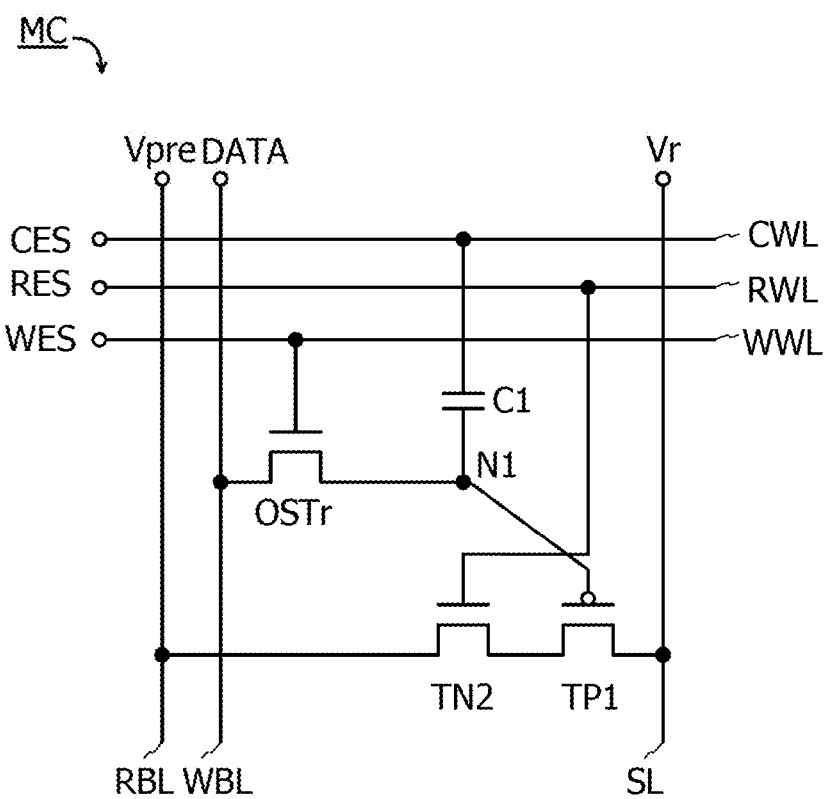
FIG. 23 is a circuit diagram illustrating one embodiment of the present invention.
Figure 24:
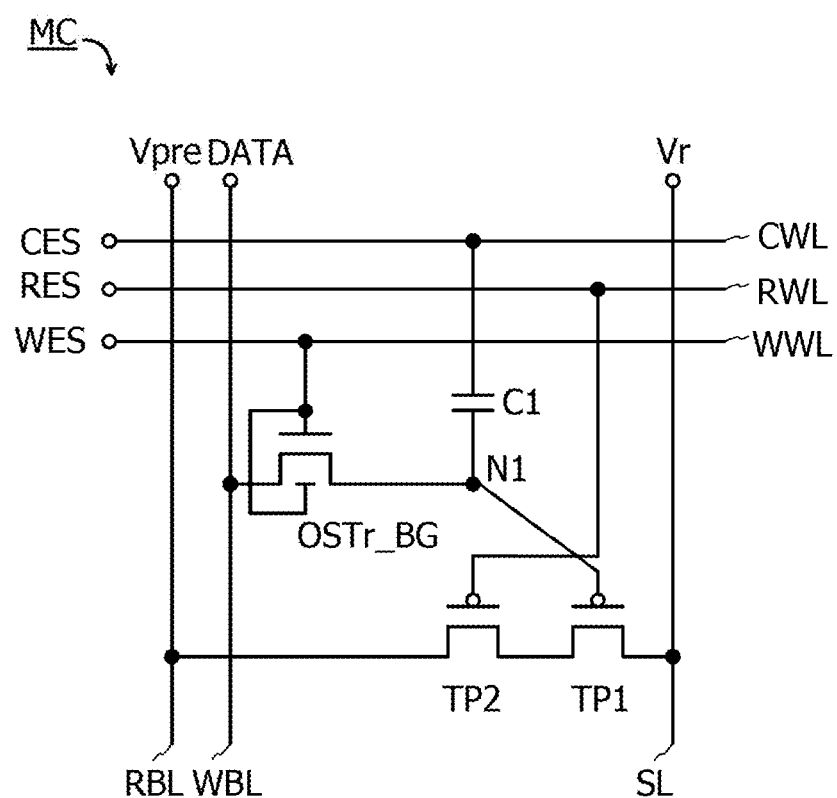
FIG. 24 is a circuit diagram illustrating one embodiment of the present invention.

When signals supplied to the wirings WWL[0]-[m−1], the wirings RWL[0]-[m−1], and the wirings CWL[0]-[m−1] in the RAM 110 of FIG. 8 are expressed as write word signals WES[0]-[m−1], read word signals RES[0]-[m−1], and capacitor word signals CES[0]-[m−1] and shown as in the timing chart of FIG. 2, the RAM 110 can operate as shown in a timing chart of FIG. 18. According to the timing chart in FIG. 18, data write to the memory cells MC in one row and data read from the memory cells MC in another row can be simultaneously performed.

As an example, in a period between time T11 and time T12 in FIG. 18, by controlling the write word signals WES[0]-[m−1], the read word signals RES[0]-[m−1], and the capacitor word signals CES[0]-[m−1] output from the row decoder 111, the data signal DATA output from the column decoder 112 is written to the memory cells MC in the first row, while potentials based on the data signal DATA retained in the memory cells MC in the m-th row are read out and sent to the column decoder 112.

In a period between time T13 and time T14 in FIG. 18, by controlling the write word signals WES[0]-[m−1], the read word signals RES[0]-[m−1], and the capacitor word signals CES[0]-[m−1] output from the row decoder 111, the data signal DATA output from the column decoder 112 is written to the memory cells MC in the m-th row, while potentials based on the data signal DATA retained in the memory cells MC in the second row are read out and sent to the column decoder 112.

That is, in the RAM 110 illustrated in FIG. 8, the operation of writing data to the memory cells MC in an i-th row and the operation of reading data from the memory cells MC in a j-th row (i≠j, where i and j are each a natural number) can be performed in the same period.

In the RAM including the memory cells MC described in Embodiment 1, data write and read can be controlled independently as in dual-port SRAM, so that data write and read can be simultaneously performed and fast access is achieved as in dual-port SRAM. The configuration of the memory cell MC achieves a function of dual-port SRAM with fewer transistors, leading to a smaller memory cell area than that of dual-port SRAM.

<Configuration Example of Row Decoder>

Figure 9:
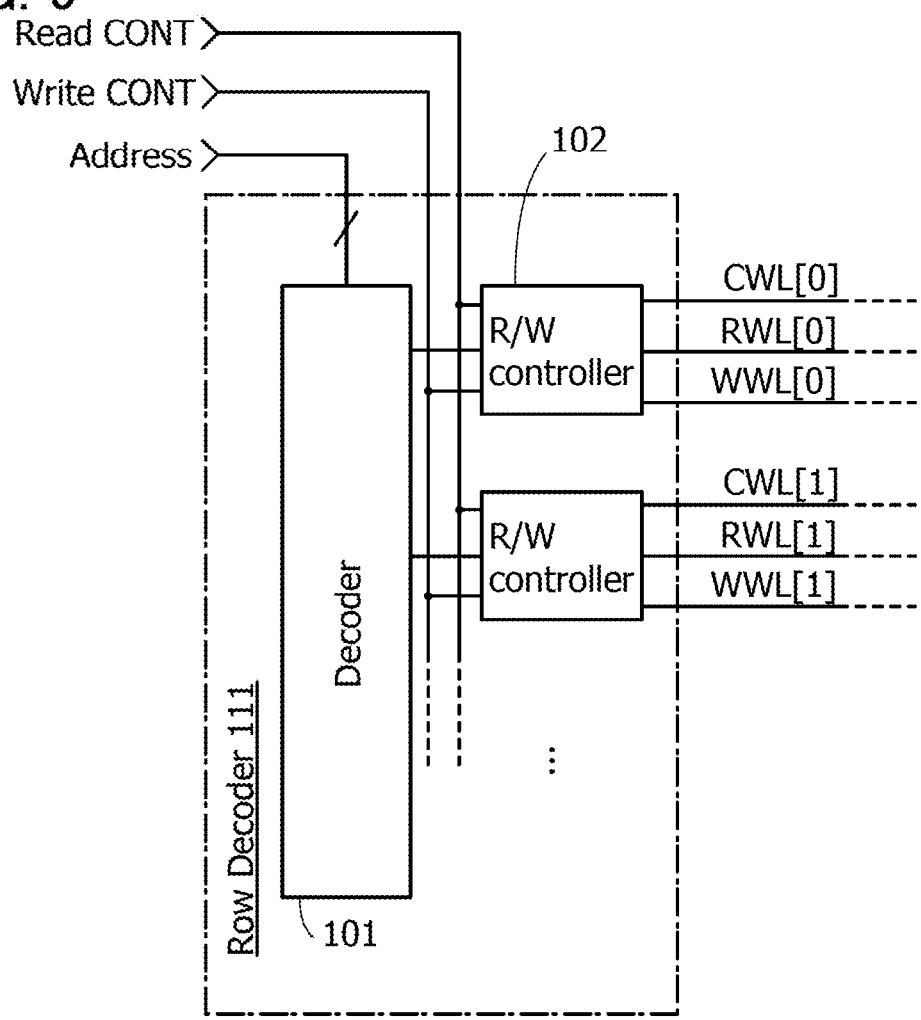
FIG. 9 is a circuit block diagram illustrating one embodiment of the present invention.

FIG. 9 is a block diagram illustrating a configuration example of the row decoder 111 in FIG. 8.

The row decoder 111 illustrated in FIG. 9 includes a decoder 101 and read/write controllers 102. The read/write controller 102 is provided for every row of the wirings WWL, the wirings RWL, and the wirings CWL. That is, the read/write controller 102 of each row is connected to a corresponding one of the wirings WWL[0]-[m−1], a corresponding one of the wirings RWL[0]-[m−1], and a corresponding one of the wirings CWL[0]-[m−1].

The decoder 101 is a circuit having a function of outputting a signal for selecting a row of the wiring WWL, the wiring RWL, and the wiring CWL. Specifically, the decoder 101 receives an address signal Address and selects the read/write controller 102 in any row in accordance with the address signal Address. With the decoder 101, the row decoder 111 can select a given row to write or read data.

The read/write controller 102 is a circuit having a function of selectively outputting a write word signal and a capacitor word signal (or a read word signal and a capacitor word signal) to the wiring WWL, the wiring RWL, and the wiring CWL in a row selected by the decoder 101.

Specifically, the read/write controller 102 receives a write control signal Write CONT and a read control signal Read CONT and selectively outputs signals supplied to the wiring WWL, the wiring RWL, and the wiring CWL in accordance with these input signals. With the read/write controllers 102, the row decoder 111 can output a write word signal and a capacitor word signal (or a read word signal and a capacitor word signal) in a selective manner.

<Configuration Example of Column Decoder>

Figure 10:
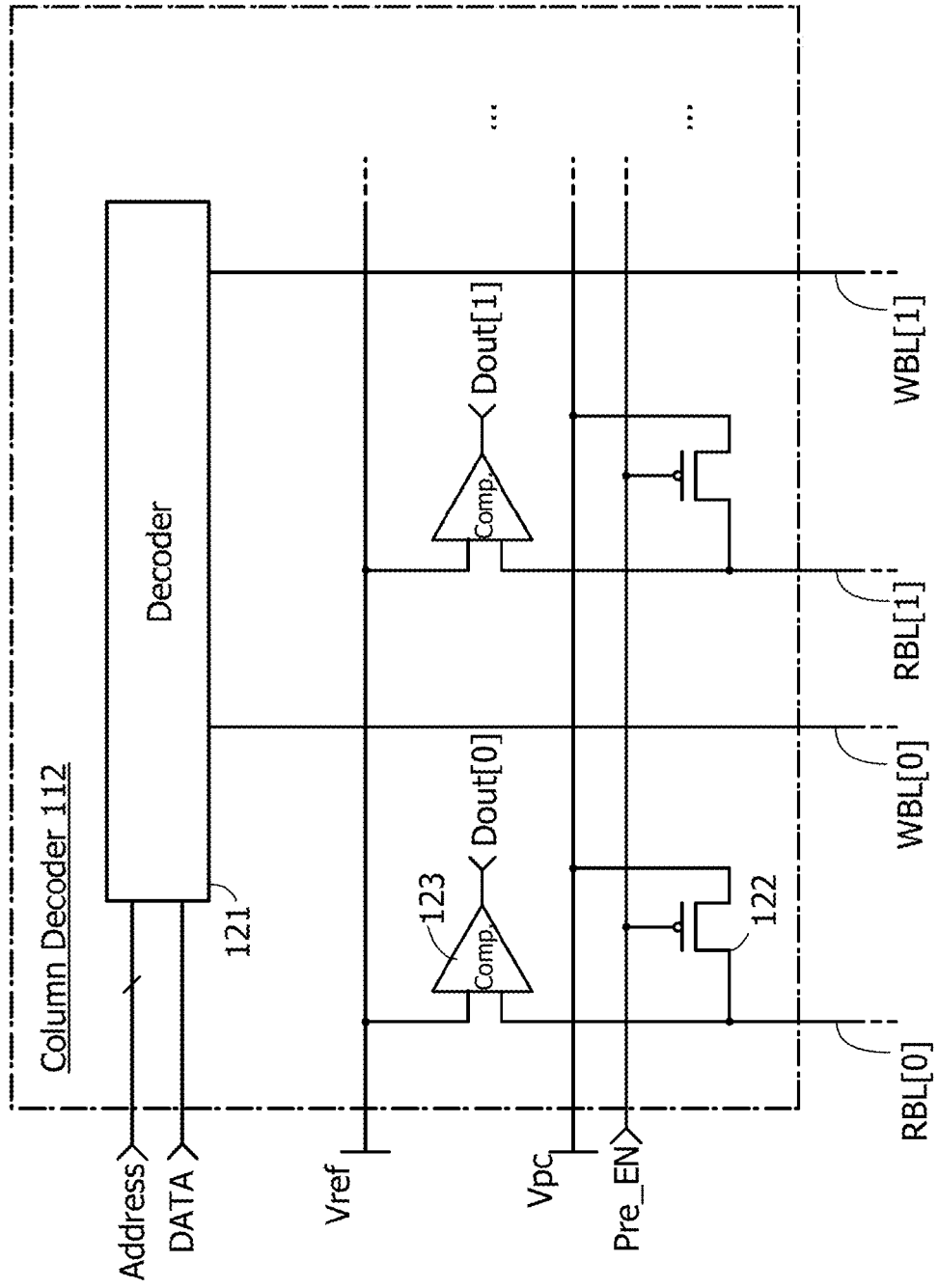
FIG. 10 is a circuit block diagram illustrating one embodiment of the present invention.

FIG. 10 is a block diagram showing a configuration example of the column decoder 112 in FIG. 8.

The column decoder 112 illustrated in FIG. 10 includes a decoder 121, transistors 122, and comparators 123. The transistor 122 and the comparator 123 are provided for every column. Outputs of the decoder 121 are connected to the wirings WBL[0]-[n−1]. The transistor 122 and the comparator 123 of each column are connected to a corresponding one of the wirings RBL[0]-[n−1].

The decoder 121 is a circuit with a function of selecting a column of the wiring RBL and sorting and outputting input data. Specifically, the decoder 121 receives the address signal Address and the data signal DATA, and outputs the data signal DATA to any of the columns in accordance with the address signal Address. With the decoder 121, the column decoder 112 can output the data signal DATA to a given column of the wirings WBL[0]-[n−1].

Note that a latch circuit for storing the data signal DATA temporarily may be provided between the decoder 121 and each of the wirings WBL[0]-[n−1]. With the latch circuits, the column decoder 112 can write the data signal DATA at an opportune time.

The transistor 122 has a function of supplying the potential Vpc for precharging to the wiring RBL and a function of making the wiring RBL electrically floating. Specifically, the transistor 122 functions as a switch that supplies the potential Vpc to the wiring RBL in response to a precharge control signal Pre_EN and then makes the wiring RBL electrically floating. With the transistor 122, the column decoder 112 can keep the wiring RBL electrically floating after the potential Vpc is supplied to the wiring RBL.

The comparator 123 has a function of comparing the levels of the potential Vpc of the wiring RBL and a reference voltage Vref and outputting a read data signal to wirings Dout[0]-[n−1]. With the comparator 123, the column decoder 112 can output data retained in the memory cell MC to the outside through the wiring RBL.

This embodiment can be implemented in combination with any of the other embodiments as appropriate.

Embodiment 3

This embodiment will explain an oxide semiconductor layer that can be used as a semiconductor layer of the transistor with low off-state current described in the foregoing embodiment.

An oxide semiconductor used for a channel formation region in the semiconductor layer of the transistor preferably contains at least indium (In) or zinc (Zn). In particular, the oxide semiconductor preferably contains both In and Zn. The oxide semiconductor preferably contains a stabilizer for strongly bonding oxygen, in addition to In and Zn. The oxide semiconductor preferably contains at least one of gallium (Ga), tin (Sn), zirconium (Zr), hafnium (Hf), and aluminum (Al) as the stabilizer.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide with an atomic ratio of In:Ga:Zn=1:1:1, 3:1:2, or 2:1:3 or an oxide with an atomic ratio close to the above atomic ratios can be used.

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For this reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment. Moreover, treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density of $1\times10^{17}/cm^3$ or lower, $1\times10^{16}/cm^3$ or lower, $1\times10^{15}/cm^3$ or lower, $1\times10^{14}/cm^3$ or lower, $1\times10^{13}/cm^3$ or lower, lower than $8\times10^{11}/cm^3$, lower than $1\times10^{11}/cm^3$, preferably lower than $1\times10^{10}/cm^3$ and $1\times10^{-9}/cm^3$ or higher.

The transistor including an i-type or substantially i-type oxide semiconductor film can have extremely favorable leakage current characteristics. For example, the off-state drain current of the transistor including the oxide semiconductor film can be $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C. Note that the off state of an n-channel transistor refers to a state where a gate voltage is sufficiently lower than the threshold voltage. Specifically, the transistor is off when the gate voltage is lower than the threshold voltage by 1 V or higher, 2 V or higher, or 3 V or higher.

The oxide semiconductor film may contain one or more of an oxide semiconductor having a single crystal structure (hereinafter referred to as a single crystal oxide semiconductor), an oxide semiconductor having a polycrystalline structure (hereinafter referred to as a polycrystalline oxide semiconductor), an oxide semiconductor having a microcrystalline structure (hereinafter referred to as a microcrystalline oxide semiconductor), and an oxide semiconductor having an amorphous structure (hereinafter referred to as an amorphous oxide semiconductor). The oxide semiconductor film may be a c-axis aligned crystalline oxide semiconductor (CAAC-OS) film. Furthermore, the oxide semiconductor film may contain an amorphous oxide semiconductor and an oxide semiconductor having a crystal grain. A CAAC-OS and a microcrystalline oxide semiconductor are described below as typical examples.

First, a CAAC-OS film is described.

The CAAC-OS film is an oxide semiconductor film having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter such a surface is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

FIG. 11A is a cross-sectional TEM image of a CAAC-OS film. FIG. 11B is a cross-sectional TEM image obtained by enlarging the image of FIG. 11A. In FIG. 11B, atomic arrangement is highlighted for easy understanding.

FIG. 11C is Fourier transform images of regions each surrounded by a circle (with a diameter of approximately 4 nm) between A and O and between O and A' in FIG. 11A. C-axis alignment can be observed in each region in FIG. 11C. The c-axis direction between A and O is different from that between O and A', which indicates that a grain in the region between A and O is different from that between O and A'. In addition, between A and O, the angle of the c-axis changes gradually and continuously from 14.3° to 16.6° to 26.4°. Similarly, between O and A', the angle of the c-axis changes gradually and continuously from −18.3° to −17.6° to −15.9°.

In an electron diffraction pattern of the CAAC-OS film, spots (bright spots) indicating alignment are shown. For example, when electron diffraction with an electron beam having a diameter of 1 nm to 30 nm, for example (such electron diffraction is also referred to as nanobeam electron diffraction) is performed on the top surface of the CAAC-OS film, spots are observed (see FIG. 12A).

From the results of the cross-sectional TEM image and the plan-view TEM image, alignment is found in the crystal parts of the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan-view TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently at a diffraction angle (2θ) of around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently at 2θ of around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. On the other hand, in the case of a CAAC-OS film, a peak is not clearly observed when φ scan is performed with 2θ fixed at around 56°.

According to the above results, in the CAAC-OS film, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, when the shape of the CAAC-OS film is changed by etching or the like, the c-axis of the crystal might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Moreover, when an impurity is added to the CAAC-OS film, a region to which the impurity is added is altered, and the proportion of the c-axis aligned crystal parts in the CAAC-OS film sometimes varies depending on regions.

When the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. The impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Consequently, a transistor including such an oxide semiconductor film rarely has negative threshold voltage (rarely has normally-on characteristics). The highly purified intrinsic or substantially highly purified intrinsic oxide semiconductor film has few carrier traps; therefore, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, a crystal part in the microcrystalline oxide semiconductor film ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. In a TEM image of the nc-OS film, a grain boundary cannot be found clearly in some cases.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film; thus, the orientation of the whole film is not observed. Consequently, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter larger than the diameter of a crystal part (e.g., having a probe diameter of 50 nm or larger). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are sometimes shown. Also in a nanobeam electron diffraction pattern of the nc-OS film, a plurality of spots are sometimes shown in a ring-like region (see FIG. 12B).

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 12A:
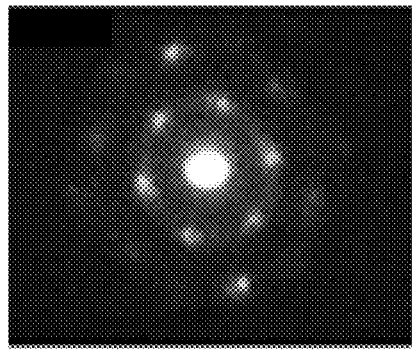
FIGS. 12A and 12B show nanobeam electron diffraction patterns of oxide semiconductor films.
Figure 12B:
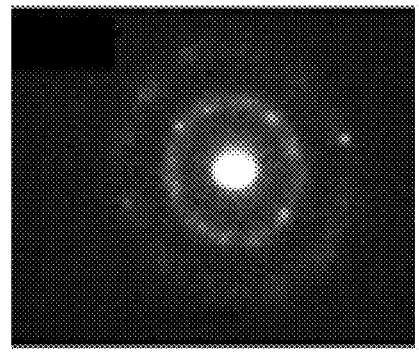
Figure 12C:
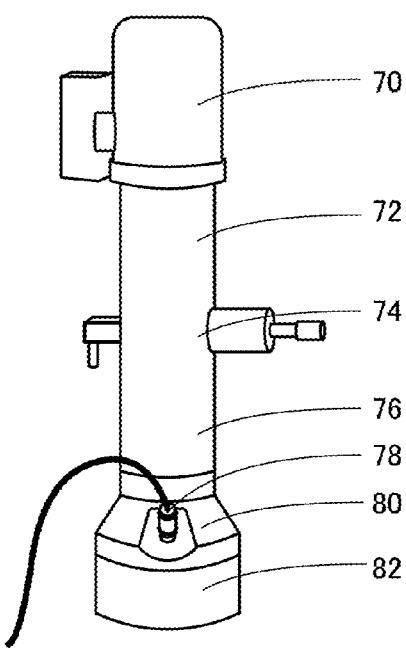
FIGS. 12C and 12D illustrate an example of a transmission electron diffraction measurement apparatus.

FIG. 12C illustrates a transmission electron diffraction measurement apparatus that includes an electron gun chamber 70, an optical system 72 below the electron gun chamber 70, a sample chamber 74 below the optical system 72, an optical system 76 below the sample chamber 74, an observation chamber 80 below the optical system 76, a camera 78 installed in the observation chamber 80, and a film chamber 82 below the observation chamber 80. The camera 78 is provided to face toward the inside of the observation chamber 80. Note that the film chamber 82 is not necessarily provided.

Figure 12D:
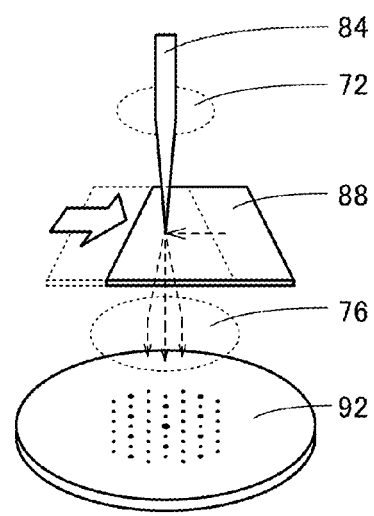

FIG. 12D illustrates an internal structure of the transmission electron diffraction measurement apparatus in FIG. 12C. In the transmission electron diffraction measurement apparatus, a substance 88 that is positioned in the sample chamber 74 is irradiated with electrons emitted from an electron gun installed in the electron gun chamber 70 through the optical system 72. The electrons that have passed through the substance 88 enter a fluorescent plate 92 installed in the observation chamber 80 through the optical system 76. A pattern depending on the intensity of the incident electrons appears in the fluorescent plate 92, so that the transmission electron diffraction pattern can be measured.

The camera 78 is installed to face the fluorescent plate 92 and can take an image of a pattern appearing in the fluorescent plate 92. An angle formed by an upper surface of the fluorescent plate 92 and a straight line that passes through the center of a lens of the camera 78 and the center of the fluorescent plate 92 ranges from 15° to 80°, from 30° to 75°, or from 45° to 70°, for example. As the angle becomes smaller, distortion of the transmission electron diffraction pattern taken by the camera 78 becomes larger. Note that if the angle is obtained in advance, the distortion of an obtained transmission electron diffraction pattern can be corrected. The film chamber 82 may be provided with the camera 78. For example, the camera 78 may be set in the film chamber 82 so as to be opposite to the incident direction of electrons 84. In this case, a transmission electron diffraction pattern with less distortion can be taken from the rear surface of the fluorescent plate 92.

A holder for fixing the substance 88 that is a sample is provided in the sample chamber 74. The holder transmits electrons passing through the substance 88. The holder may have, for example, a function of moving the substance 88 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 88.

Next, a method for measuring a transmission electron diffraction pattern of a substance by the aforementioned transmission electron diffraction measurement apparatus will be described.

For example, changes in the structure of a substance can be observed by changing the irradiation position of the electrons 84 that are a nanobeam on the substance (or by scanning) as illustrated in FIG. 12D. At this time, when the substance 88 is a CAAC-OS film, a diffraction pattern such as one shown in FIG. 12A is observed. When the substance 88 is an nc-OS film, a diffraction pattern such as one shown in FIG. 12B is observed.

Even when the substance 88 is a CAAC-OS film, a diffraction pattern similar to that of an nc-OS film or the like is partly observed in some cases. Therefore, the quality of a CAAC-OS film can be sometimes represented by the proportion of a region where a diffraction pattern of a CAAC-OS film is observed in a predetermined area (also referred to as proportion of CAAC (c-axis aligned crystal)). In a high-quality CAAC-OS film, for example, the proportion of CAAC is 50% or higher, preferably 80% or higher, further preferably 90% or higher, still further preferably 95% or higher. Note that a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/s and the obtained diffraction patterns were converted into still images every 0.5 seconds. As an electron beam, a nanobeam with a probe diameter of 1 nm was used. The above measurement was performed on six samples. The proportion of CAAC was calculated using the average value of the six samples.

Figure 13A:
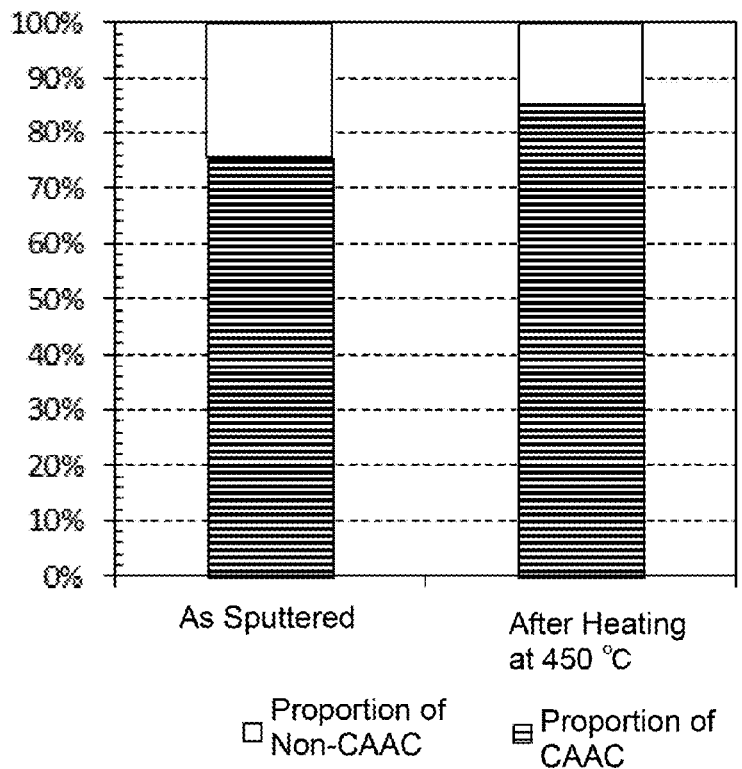
FIG. 13A shows an example of structural analysis by transmission electron diffraction measurement.

FIG. 13A shows the proportion of CAAC in each sample. The proportion of CAAC of the as-sputtered CAAC-OS film was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., 400° C. or higher) reduces the proportion of non-CAAC (increases the proportion of CAAC). The above results also indicate that the CAAC-OS film can have a high proportion of CAAC even when the temperature of the heat treatment is lower than 500° C.

Here, most of diffraction patterns different from that of a CAAC-OS film were similar to that of an nc-OS film. Furthermore, an amorphous oxide semiconductor film was not observed in the measurement region. Therefore, the above results suggest that the region having a structure similar to that of an nc-OS film is rearranged by heat treatment owing to the influence of the structure of the adjacent region, whereby the region becomes CAAC.

Figure 13B:
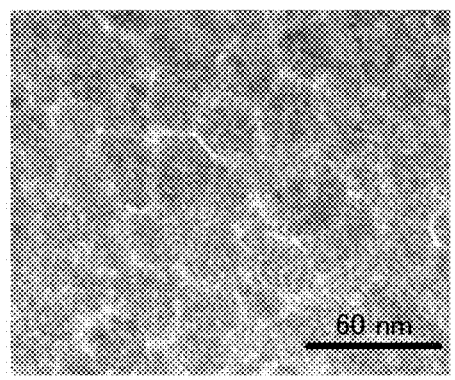
FIGS. 13B and 13C are plan-view TEM images.
Figure 13C:
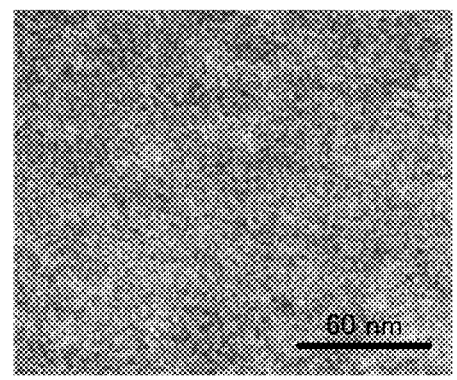

FIGS. 13B and 13C are plan-view TEM images of the as-sputtered CAAC-OS film and the CAAC-OS film subjected to the heat treatment at 450° C., respectively. Comparison between FIGS. 13B and 13C shows that the CAAC-OS film subjected to the heat treatment at 450° C. has more uniform film quality. That is, heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in the other embodiments.

Embodiment 4

In this embodiment, an example of a cross-sectional structure of a transistor used in a semiconductor device of one embodiment of the disclosed invention will be described with reference to drawings.

Figure 14:
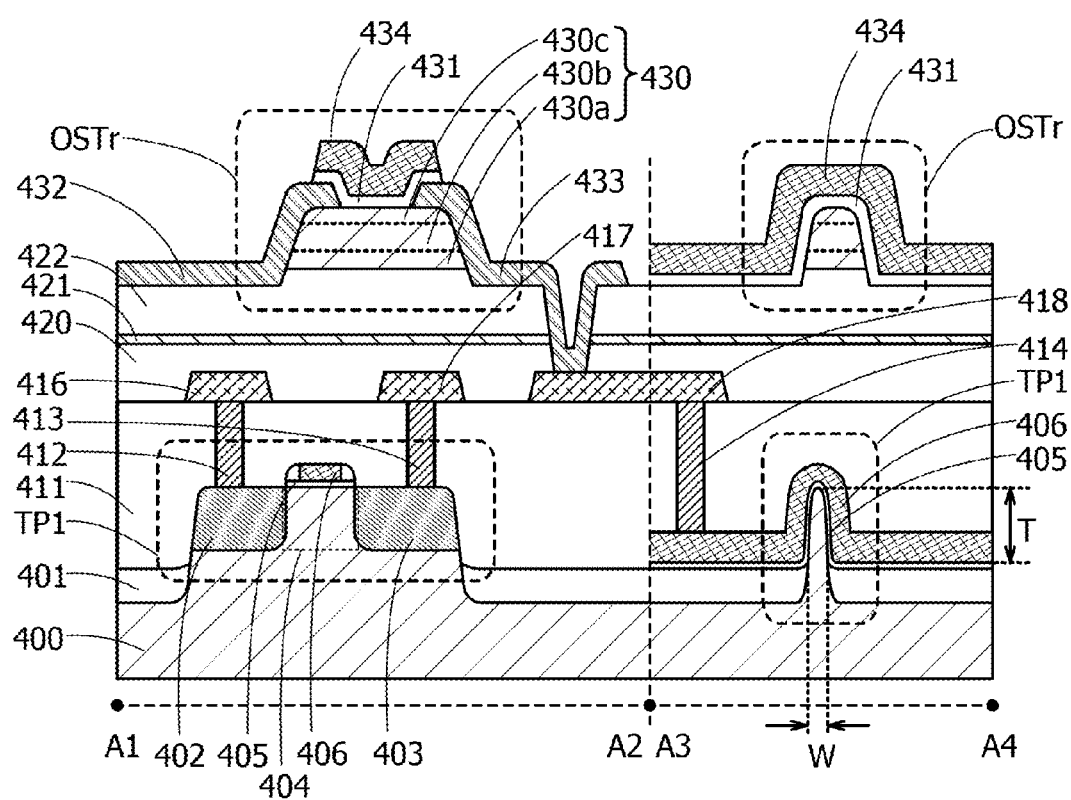
FIG. 14 is a cross-sectional view illustrating one embodiment of the present invention.

FIG. 14 illustrates an example of part of a cross-sectional structure of a circuit portion of one embodiment of the present invention. FIG. 14 shows an example of a cross-sectional structure of the transistor OSTr and the transistor TP1 illustrated in FIG. 1 of Embodiment 1. A region along the dashed line A1-A2 shows structures of the transistors OSTr and TP1 in the channel length direction, and a region along the dashed line A3-A4 shows structures of the transistors OSTr and TP1 in the channel width direction. Note that in one embodiment of the present invention, the channel length direction of the transistor OSTr is not necessarily the same as that of the transistor TP1.

The channel length direction denotes a direction in which carriers move at the shortest distance between a pair of impurity regions serving as a source region and a drain region. The channel width direction denotes a direction perpendicular to the channel length direction.

In FIG. 14, the transistor OSTr including a channel formation region in an oxide semiconductor film is formed over the transistor TP1 including a channel formation region in a single crystal silicon substrate. With the structure in FIG. 14, parts of transistors, for example, the channel formation region of the transistors OSTr and the channel formation region of the transistor TP1 can be provided to overlap with each other. Thus, this structure can reduce the layout area of the semiconductor device.

The transistor TP1 may include the channel formation region in a semiconductor film or a semiconductor substrate of silicon, germanium, or the like in an amorphous, microcrystalline, polycrystalline, or single crystal state. Alternatively, the transistor TP1 may include the channel formation region in an oxide semiconductor film or an oxide semiconductor substrate. In the case where channel formation regions of all the transistors are included in an oxide semiconductor film or an oxide semiconductor substrate, the transistor OSTr is not necessarily stacked over the transistor TP1, and the transistors OSTr and TP1 may be formed in the same layer.

When the transistor TP1 is formed using a thin silicon film, any of the following can be used, for example: amorphous silicon formed by sputtering or vapor phase growth such as plasma-enhanced chemical vapor deposition (CVD); polycrystalline silicon obtained by crystallization of amorphous silicon by laser annealing or the like; and single crystal silicon obtained by separation of a surface portion of a single crystal silicon wafer by implantation of hydrogen ions or the like into the silicon wafer.

A substrate 400 where the transistor TP1 is formed can be, for example, a silicon substrate, a germanium substrate, or a silicon germanium substrate. In FIG. 14, a single crystal silicon substrate is used as the substrate 400.

The transistor TP1 is electrically isolated by an element isolation method. An example of the element isolation method is a trench isolation method (shallow trench isolation: STI). FIG. 14 illustrates an example where the trench isolation method is used to electrically isolate the transistor TP1. Specifically, in FIG. 14, the transistor TP1 is electrically isolated by using an element isolation region 401 formed in such a manner that an insulator containing silicon oxide or the like is buried in a trench formed in the substrate 400 by etching or the like and then the insulator is partly removed by etching or the like.

In a projection of the substrate 400 that exists in a region other than the trench, an impurity region 402 and an impurity region 403 of the transistor TP1 and a channel formation region 404 placed between the impurity regions 402 and 403 are provided. The transistor TP1 also includes an insulating film 405 covering the channel formation region 404 and a gate electrode 406 that overlaps with the channel formation region 404 with the insulating film 405 placed therebetween.

In the transistor TP1, a side portion and an upper portion of the projection in the channel formation region 404 overlaps with the gate electrode 406 with the insulating film 405 positioned therebetween, so that carriers flow in a wide area (including a side portion and an upper portion of the channel formation region 404). Thus, an area over the substrate occupied by the transistor TP1 is reduced, and the number of transferred carriers in the transistor TP1 is increased. As a result, the field-effect mobility and on-state current of the transistor TP1 are increased. Suppose the length of the projection of the channel formation region 404 in the channel width direction (i.e., channel width) is W and the thickness of the projection of the channel formation region 404 is T. When the aspect ratio that corresponds to the ratio of the thickness T to the channel width W is high, a region where carrier flows becomes wider. Thus, the on-state current and field-effect mobility of the transistor TP1 can be further increased.

Note that when the transistor TP1 is formed using a bulk semiconductor substrate, the aspect ratio is preferably 0.5 or more, further preferably 1 or more.

An insulating film 411 is provided over the transistor TP1. Openings are formed in the insulating film 411. A conductive film 412, a conductive film 413, and a conductive film 414 that are electrically connected to the impurity region 402, the impurity region 403, and the gate electrode 406, respectively, are formed in the openings.

The conductive film 412 is electrically connected to a conductive film 416 over the insulating film 411. The conductive film 413 is electrically connected to a conductive film 417 over the insulating film 411. The conductive film 414 is electrically connected to a conductive film 418 over the insulating film 411.

An insulating film 420 is provided over the conductive films 416 to 418. An insulating film 421 having an effect of blocking diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using silicon nitride or silicon nitride oxide, for example.

An insulating film 422 is provided over the insulating film 421. The transistor OSTr is provided over the insulating film 422.

The transistor OSTr includes, over the insulating film 422, a semiconductor film 430 containing an oxide semiconductor, conductive films 432 and 433 that are electrically connected to the semiconductor film 430 and functions as source and drain electrodes, a gate insulating film 431 covering the semiconductor film 430, and a gate electrode 434 that overlaps with the semiconductor film 430 with the gate insulating film 431 positioned therebetween. An opening is formed in the insulating films 420 to 422. The conductive film 433 is connected to the conductive film 418 in the opening.

Note that in FIG. 14, the transistor OSTr includes the gate electrode 434 on at least one side of the semiconductor film 430; alternatively, the transistor OSTr may also include a gate electrode that overlaps with the semiconductor film 430 with the insulating film 422 placed therebetween.

When the transistor OSTr includes a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as a ground potential may be supplied only to the other of the gate electrodes. By controlling the level of a potential supplied to the other of the gate electrodes, the threshold voltage of the transistor can be controlled.

In FIG. 14, the transistor OSTr has a single-gate structure where one channel formation region corresponding to one gate electrode 434 is provided. Alternatively, the transistor OSTr may have a multi-gate structure where a plurality of gate electrodes electrically connected to each other are provided so that a plurality of channel formation regions are included in one active film.

FIG. 14 illustrates the example in which the semiconductor film 430 in the transistor OSTr includes the oxide semiconductor films 430a to 430c that are stacked in this order over the insulating film 422. However, in one embodiment of the present invention, the semiconductor film 430 of the transistor OSTr may be a single metal oxide film.

The insulating film 422 preferably has a function of supplying oxygen to the oxide semiconductor films 430a to 430c by heating. It is preferable that the number of defects in the insulating film 422 be small, and that typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 422 is preferably formed using an oxide to have a function of supplying oxygen to the oxide semiconductor films 430a to 430c by heating. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by plasma-enhanced CVD, sputtering, or the like.

Note that in this specification, oxynitride contains more oxygen than nitrogen, and nitride oxide contains more nitrogen than oxygen.

Note that in the transistor OSTr illustrated in FIG. 14, the gate electrode 434 overlaps with end portions of the oxide semiconductor film 430b including a channel region that do not overlap with the conductive films 432 and 433, that is, end portions of the oxide semiconductor film 430b that are in a region different from regions where the conductive films 432 and 433 are located. If the end portions of the oxide semiconductor film 430b are exposed to plasma by etching for forming the end portions, chlorine radical, fluorine radical, or the like generated from an etching gas is easily bonded to a metal element contained in the oxide semiconductor. For this reason, in the end portions of the oxide semiconductor film, oxygen bonded to the metal element is easily released, so that an oxygen vacancy is easily formed and the oxide semiconductor film easily has n-type conductivity. However, in the transistor OSTr in FIG. 14, since the end portions of the oxide semiconductor film 430b that do not overlap with the conductive films 432 and 433 overlap with the gate electrode 434, an electric field applied to the end portions can be adjusted by controlling the potential of the gate electrode 434. Consequently, the flow of current between the conductive films 432 and 433 through the end portions of the oxide semiconductor film 430b can be controlled by a potential supplied to the gate electrode 434. This structure of the transistor OSTr is referred to as a surrounded channel (s-channel) structure.

Specifically, in the s-channel structure, when a potential at which the transistor OSTr is turned off is supplied to the gate electrode 434, the amount of off-state current that flows between the conductive films 432 and 433 through the end portions of the oxide semiconductor film 430b can be small. For this reason, even when the distance between the conductive films 432 and 433 at the end portions of the oxide semiconductor film 430b is reduced in the transistor OSTr as a result of reducing the channel length to obtain high on-state current, the transistor OSTr can exhibit low off-state current. Thus, the transistor OSTr with a short channel length can exhibit high on-state current and low off-state current.

Specifically, in the s-channel structure, when a potential at which the transistor OSTr is turned on is supplied to the gate electrode 434, the amount of current that flows between the conductive films 432 and 433 through the end portions of the oxide semiconductor film 430b can be large. The current contributes to an increase in the field-effect mobility and on-state current of the transistor OSTr. With the overlap of the end portions of the oxide semiconductor film 430b and the gate electrode 434, carriers flow in a wide region of the oxide semiconductor film 430b without being limited to a region in the vicinity of the interface of the oxide semiconductor film 430b near the insulating film 431, leading to an increase in the amount of carriers that move in the transistor OSTr. As a result, the on-state current of the transistor OSTr is increased, and the field-effect mobility is increased to 10 cm$^2$/V·s or higher or to 20 cm$^2$/V·s or higher, for example. Here, field-effect mobility is not an approximate value of the mobility as the physical property of the oxide semiconductor film, but is an index of current drive capability in a saturation region of the transistor and apparent field-effect mobility.

Figure 15:
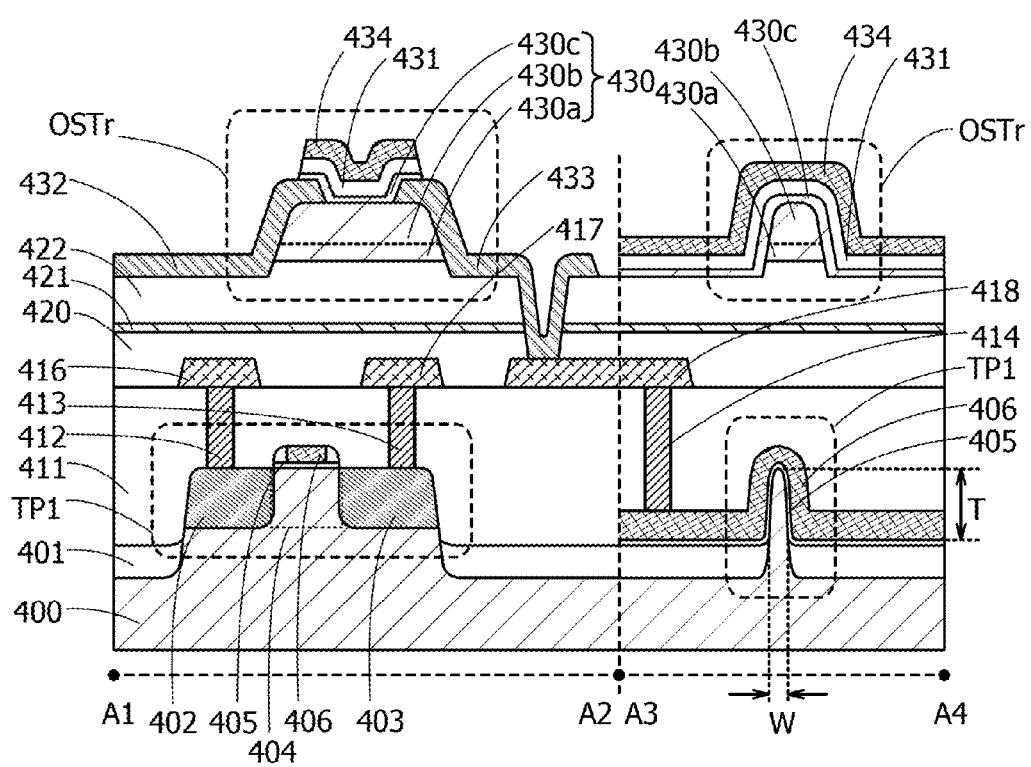
FIG. 15 is a cross-sectional view illustrating one embodiment of the present invention.

Although this embodiment is described with reference to FIG. 14, one embodiment of the present invention is not limited to this structure. For example, a structure illustrated in FIG. 15 may be employed.

Note that the structures, methods, and the like described in this embodiment can be used as appropriate in combination with any of the structures, methods, and the like described in the other embodiments.

Embodiment 5

Although the conductive film and the semiconductor film described in the above embodiments can be formed by sputtering, they may be formed by another method, for example, a thermal CVD method. Examples of a thermal CVD method include metal organic chemical vapor deposition (MOCVD) and atomic layer deposition (ALD).

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of a substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For instance, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of a substrate to form a first layer, and then, the second source gas is introduced to react with the first layer. As a result, a second layer is stacked over the first layer, so that a thin film is formed. The sequence of the gas introduction is repeated multiple times until a desired thickness is obtained, whereby a thin film with excellent step coverage can be formed. The thickness of the thin film can be adjusted by the number of repetitions of the sequence of the gas introduction; therefore, an ALD method makes it possible to accurately adjust a thickness and thus is suitable for manufacturing a minute FET.

The conductive film and the semiconductor film described in the above embodiments can be formed by thermal CVD such as MOCVD or ALD. For example, trimethylindium, trimethylgallium, and dimethylzinc are used to form an In—Ga—Zn—O film. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, when a tungsten film is formed with a deposition apparatus using ALD, a $WF_6$ gas and a $B_2H_6$ gas are sequentially introduced multiple times to form an initial tungsten film, and then a $WF_6$ gas and an $H_2$ gas are introduced at a time, so that a tungsten film is formed. Note that a $SiH_4$ gas may be used instead of a $B_2H_6$ gas.

When an oxide semiconductor film, for example, an In—Ga—Zn—O film is formed with a deposition apparatus using ALD, an $In(CH_3)_3$ gas and an $O_3$ gas are sequentially introduced multiple times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Although an $H_2O$ gas obtained by bubbling with an inert gas such as Ar may be used instead of an $O_3$ gas, it is preferable to use an $O_3$ gas, which does not contain H. Furthermore, an $In(C_2H_5)_3$ gas may be used instead of an $In(CH_3)_3$ gas. A $Ga(C_2H_5)_3$ gas may be used instead of a $Ga(CH_3)_3$ gas. Moreover, a $Zn(CH_3)_2$ gas may be used.

The structure described in this embodiment can be combined as appropriate with any of the structures described in the other embodiments.

Embodiment 6

In this embodiment, application examples of the memory device described in the foregoing embodiment to an electronic component and to an electronic device including the electronic component will be described with reference to FIGS. 16A and 16B and FIGS. 17A to 17E.

Figure 16A:
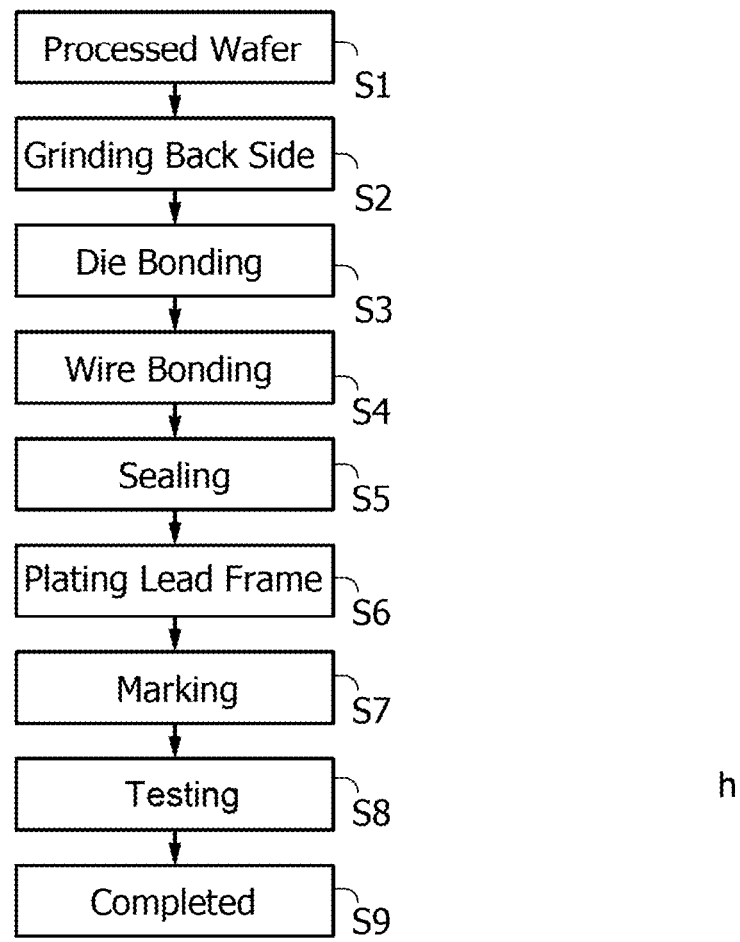
FIG. 16A is a flowchart showing a fabrication process of an electronic component.

FIG. 16A shows an example where the memory device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A memory device including the transistors illustrated in FIG. 14 of Embodiment 4 is completed by integrating detachable components on a printed circuit board through the assembly process (post-process).

The post-process can be completed through steps shown in FIG. 16A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the memory device described in the foregoing embodiment, it is possible to obtain a downsized electronic component with high-speed operation.

Figure 16B:
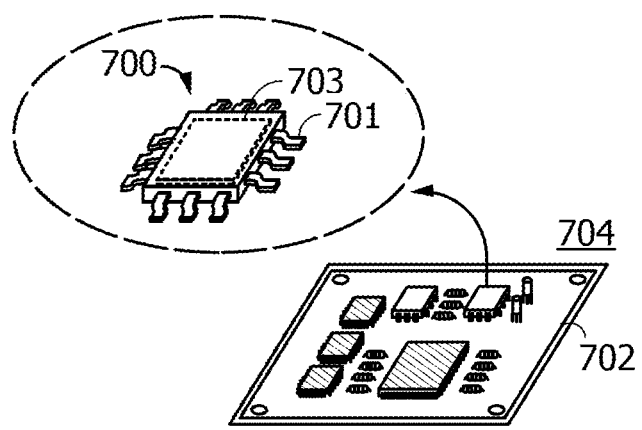
FIG. 16B is a schematic perspective view of the electronic component.

FIG. 16B is a schematic perspective diagram of a completed electronic component. FIG. 16B shows a schematic perspective diagram of a quad flat package (QFP) as an example of the electronic component. An electronic component 700 illustrated in FIG. 16B includes a lead 701 and a circuit portion 703. The electronic component 700 in FIG. 16B is, for example, mounted on a printed circuit board 702. A combination of electronic components 700 electrically connected to each other over the printed circuit board 702 can be equipped in an electronic device. A completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 17A:
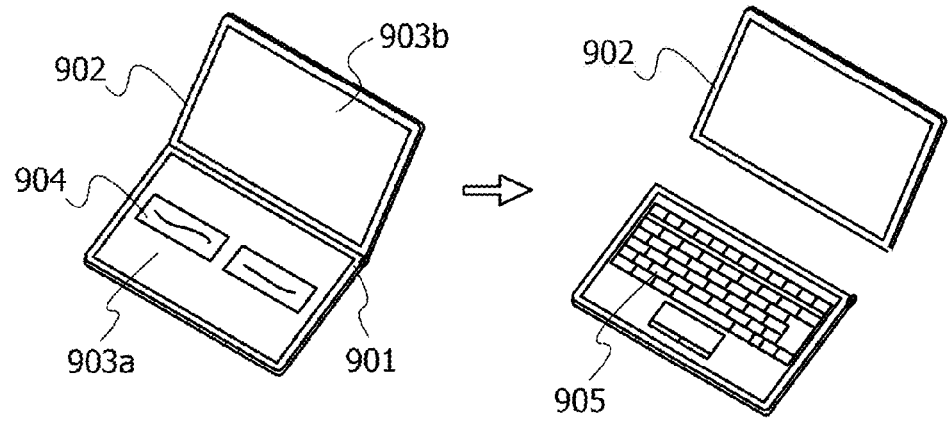
FIGS. 17A to 17E each illustrate an electronic device including an electronic component.

FIG. 17A illustrates a portable information appliance that includes a housing 901, a housing 902, a first display portion 903a, a second display portion 903b, and the like. At least one of the housings 901 and 902 is provided with the electronic component including the memory device of the foregoing embodiment. It is thus possible to obtain a downsized portable information appliance with high-speed operation.

Note that the first display portion 903a is a panel having a touch input function, and for example, as illustrated in the left of FIG. 17A, which of "touch input" and "keyboard input" is performed can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 17A. Thus, letters can be input quickly by key input as in a conventional information appliance, for example.

One of the first display portion 903a and the second display portion 903b can be detached from the portable information appliance as shown in the right of FIG. 17A. Providing the second display portion 903b with a touch input function makes the information appliance convenient to carry because the weight can be further reduced and the information appliance can operate with one hand while the other hand supports the housing 902.

The portable information appliance in FIG. 17A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 17A may transmit and receive data wirelessly. Through wireless communication, desired book data or the like can be purchased and downloaded from an e-book server.

Furthermore, the housing 902 illustrated in FIG. 17A may be equipped with an antenna, a microphone function, and a wireless communication function to be used as a mobile phone.

Figure 17B:
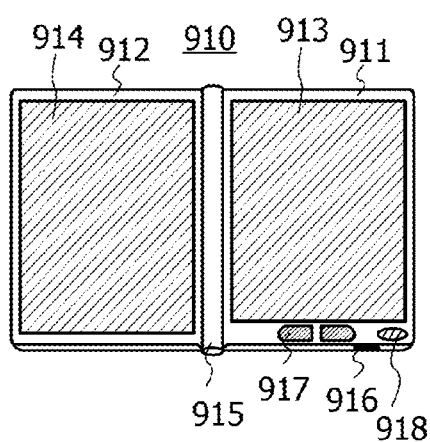

FIG. 17B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The electronic component including the memory device of the foregoing embodiment is provided in at least one of the housings 911 and 912. It is thus possible to obtain a downsized e-book reader with high-speed operation.

Figure 17C:
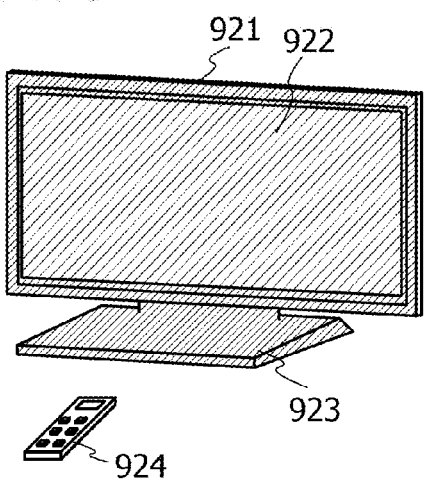

FIG. 17C illustrates a television device including a housing 921, a display portion 922, a stand 923, and the like. The television device can be controlled by a switch of the housing 921 and a separate remote controller 924. The electronic component including the memory device of the foregoing embodiment is mounted on the housings 921 and the remote controller 924. Thus, it is possible to obtain a downsized television device with high-speed operation.

Figure 17D:
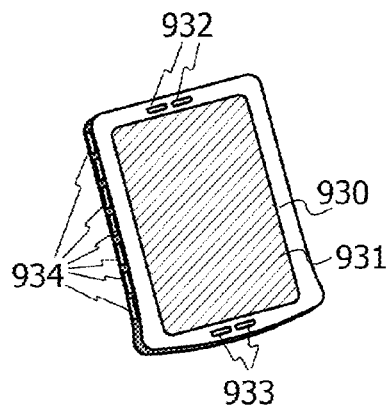

FIG. 17D illustrates a smartphone in which a main body 930 is provided with a display portion 931, a speaker 932, a microphone 933, an operation button 934, and the like. The electronic component including the memory device of the foregoing embodiment is provided in the main body 930. It is thus possible to obtain a downsized smartphone with high-speed operation.

Figure 17E:
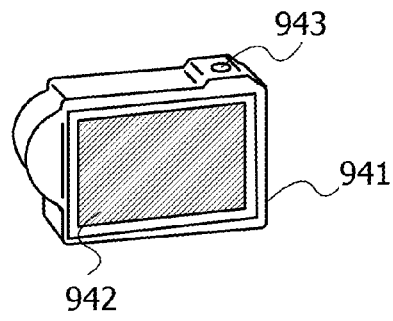

FIG. 17E illustrates a digital camera including a main body 941, a display portion 942, an operation switch 943, and the like. The electronic component including the memory device of the foregoing embodiment is provided in the main body 941. Consequently, it is possible to obtain a downsized digital camera with high-speed operation.

As described above, the electronic device shown in this embodiment incorporates the electronic component including the memory device of the foregoing embodiment, thereby being reduced in size and operating at high speed.

Note that the content (or part thereof) in one embodiment can be applied to, combined with, or exchanged with another content in the same embodiment and/or the content (or part thereof) in another embodiment or other embodiments.

Note that the content of an embodiment is one described using a variety of diagrams or text in this specification.

By combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

This application is based on Japanese Patent Application serial no. 2014-031790 filed with Japan Patent Office on Feb. 21, 2014, the entire contents of which are hereby incorporated by reference.

What is claimed is:

1. A semiconductor device comprising:
a first transistor;
a second transistor;
a third transistor; and
a capacitor,
wherein a gate of the first transistor is electrically connected to a first wiring,
wherein one of a source and a drain of the first transistor is electrically connected to a second wiring,
wherein the other of the source and the drain of the first transistor is electrically connected to a gate of the second transistor,
wherein one of a source and a drain of the second transistor is electrically connected to a third wiring,
wherein the other of the source and the drain of the second transistor is electrically connected to one of a source and a drain of the third transistor,
wherein a gate of the third transistor is electrically connected to a fourth wiring, wherein the other of the source and the drain of the third transistor is electrically connected to a fifth wiring, wherein one electrode of the capacitor is electrically connected to the gate of the second transistor, wherein the other electrode of the capacitor is electrically connected to a sixth wiring, wherein the first wiring is capable of transmitting a first signal, wherein the second wiring is capable of transmitting a second signal, wherein the third wiring is capable of transmitting a first potential, wherein the fourth wiring is capable of transmitting a third signal, wherein the fifth wiring is capable of transmitting a second potential, wherein the sixth wiring is capable of transmitting a fourth signal, wherein the first signal is capable of turning on the first transistor so that a potential of the second signal is supplied to the gate of the second transistor, wherein the third signal is capable of turning on the third transistor so that the second potential is supplied to the one of the source and the drain of the third transistor, and wherein the fourth signal is capable of controlling an on/off state of the second transistor in accordance with the potential of the second signal supplied to the gate of the second transistor so that the first potential is supplied to the other of the source and the drain of the second transistor.

2. The semiconductor device according to claim 1, wherein a channel formation region of the first transistor comprises an oxide semiconductor material.

3. The semiconductor device according to claim 1, wherein a channel formation region of the second transistor and a channel formation region of the third transistor each comprise a silicon material.

4. The semiconductor device according to claim 1, wherein a channel formation region of the first transistor partly overlaps with a channel formation region of the second transistor or a channel formation region of the third transistor.

5. A memory device comprising:
a row decoder;
a column decoder, and
a plurality of memory cells arranged in a matrix of m rows and n columns, where m and n are each a natural number, each of the plurality of memory cells comprising:
a first transistor;
a second transistor;
a third transistor; and
a capacitor,
wherein a gate of the first transistor is electrically connected to a first wiring, wherein one of a source and a drain of the first transistor is electrically connected to a second wiring, wherein the other of the source and the drain of the first transistor is electrically connected to a gate of the second transistor, wherein one of a source and a drain of the second transistor is electrically connected to a third wiring, wherein the other of the source and the drain of the second transistor is electrically connected to one of a source and a drain of the third transistor, wherein a gate of the third transistor is electrically connected to a fourth wiring, wherein the other of the source and the drain of the third transistor is electrically connected to a fifth wiring, wherein one electrode of the capacitor is electrically connected to the gate of the second transistor, wherein the other electrode of the capacitor is electrically connected to a sixth wiring, wherein the first wiring is capable of transmitting a first signal from the row decoder, wherein the second wiring is capable of transmitting a second signal from the column decoder, wherein the third wiring is capable of transmitting a first potential from the column decoder, wherein the fourth wiring is capable of transmitting a third signal from the row decoder, wherein the fifth wiring is capable of transmitting a second potential, wherein the sixth wiring is capable of transmitting a fourth signal from the row decoder, wherein the first signal is capable of turning on the first transistor so that a potential of the second signal is supplied to the gate of the second transistor, wherein the third signal is capable of turning on the third transistor so that the second potential is supplied to the one of the source and the drain of the third transistor, and wherein the fourth signal is capable of controlling an on/off state of the second transistor in accordance with the potential of the second signal supplied to the gate of the second transistor so that the first potential is supplied to the other of the source and the drain of the second transistor.

6. The memory device according to claim 5, wherein a channel formation region of the first transistor comprises an oxide semiconductor material.

7. The memory device according to claim 5, wherein a channel formation region of the second transistor and a channel formation region of the third transistor each comprise a silicon material.

8. The memory device according to claim 5, wherein a channel formation region of the first transistor partly overlaps with a channel formation region of the second transistor or a channel forming region of the third transistor.

* * * * *